United States Patent
Villa et al.

(10) Patent No.: US 12,360,741 B2
(45) Date of Patent: Jul. 15, 2025

(54) MULTIPLY OPERATION CIRCUIT, MULTIPLY AND ACCUMULATE CIRCUIT, AND METHODS THEREOF

(71) Applicant: Ferroelectric Memory GmbH, Dresden (DE)

(72) Inventors: Corrado Villa, Sovico (IT); Stefano Sivero, Comun Nuovo (IT)

(73) Assignee: FERROELECTRIC MEMORY GMBH, Dresden (DE)

( * ) Notice: Subject to any disclaimer, the term of this patent is extended or adjusted under 35 U.S.C. 154(b) by 1093 days.

(21) Appl. No.: 17/324,557

(22) Filed: May 19, 2021

(65) Prior Publication Data
US 2022/0374202 A1  Nov. 24, 2022

(51) Int. Cl.
*G06F 7/544* (2006.01)
*G06F 7/523* (2006.01)
*G11C 11/22* (2006.01)

(52) U.S. Cl.
CPC ............ *G06F 7/5443* (2013.01); *G06F 7/523* (2013.01); *G11C 11/221* (2013.01); *G11C 11/223* (2013.01)

(58) Field of Classification Search
CPC ................................ G06F 7/523; G06F 7/5443
See application file for complete search history.

(56) References Cited

U.S. PATENT DOCUMENTS 10,789,046 B1 * 9/2020 Far ........................... H03M 1/68

OTHER PUBLICATIONS

Soliman, "Ultra-Low Power Flexible Precision FeFET Based Analog In-Memory Computing", IEEE International Electron Device Meeting, https://www.researchgate.net/publication/347983577, Dec. 2020.
Chen et al., "Multiply Accumulate Operations in Memristor Crossbar Arrays for Analog Computing", Journal of Semiconductors 42(1), https://www.researchgate.net/publication/344755109, Sep. 2020.

* cited by examiner

*Primary Examiner* — Michael D. Yaary
(74) *Attorney, Agent, or Firm* — Synergy IP Group AG

(57) ABSTRACT

Various aspects relate to a multiply and accumulate circuit, the multiply and accumulate circuit including: a plurality of multiply operation cells configured in a matrix arrangement. A respective multiply operation cell of the multiply operation cells includes: a field-effect transistor and a programmable switch in a series connection, wherein the field-effect transistor and the programmable switch are configured to control a current flow through the respective multiply operation cell to realize a multiplication operation. The multiply operation cells of a set of the plurality of multiply operation cells share a corresponding control line to realize an accumulation operation in addition to the multiply operations carried out by the set of multiply operation cells.

20 Claims, 16 Drawing Sheets

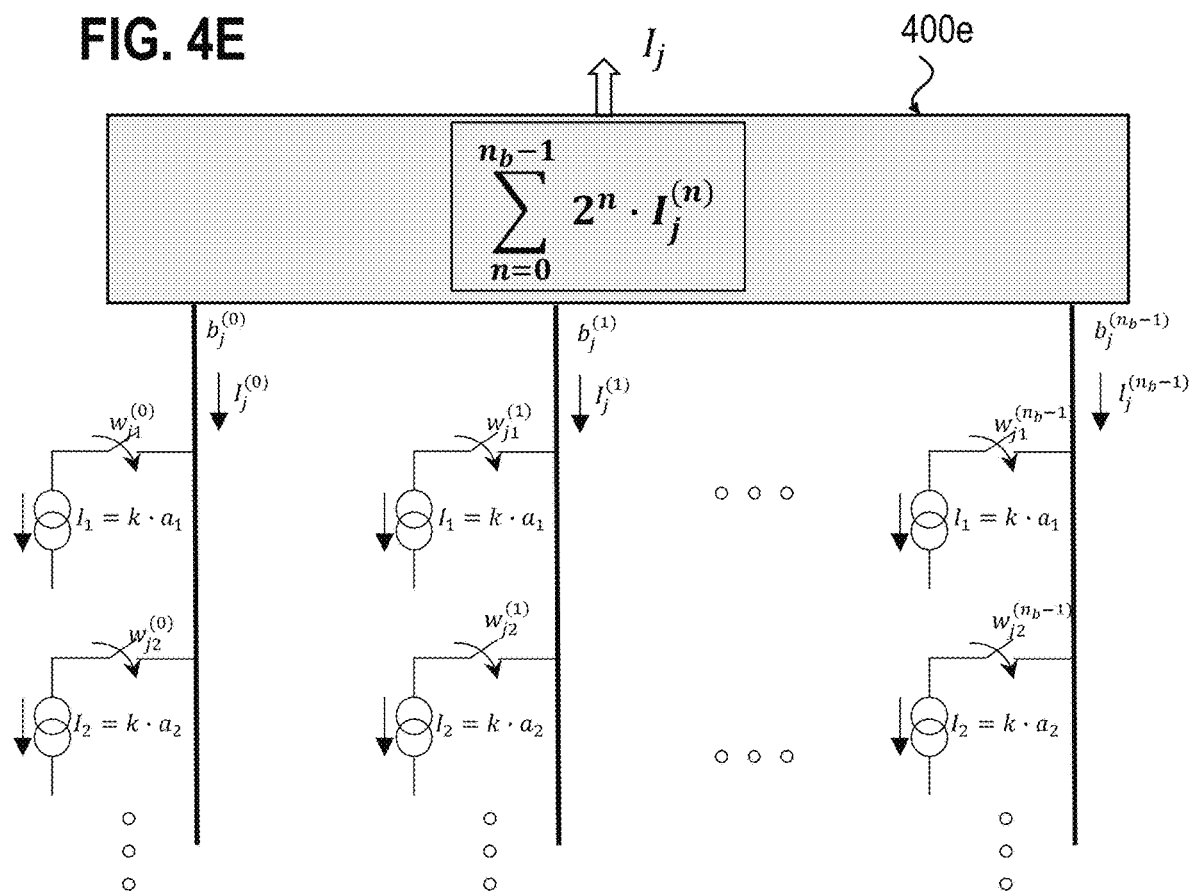

|  | PROGRAM | | | | | | | | | | | |
|---|---|---|---|---|---|---|---|---|---|---|---|---|
|  | Selected col | | | | | | Deselected col | | | | | |
|  | BL | FeFetG | SFetG | SL | hidden | B | BL | FeFetG | SFetG | SL | hidden | B |
| Selected row | 0 | 3 | 1 | 0 | 0 | 0 | 2 | 3 | 1 | 2 | 2 | 0 |
| Deselected row | 0 | 1 | 1 | 0 | 0 | 0 | 2 | 1 | 1 | 2 | 0 | 0 |

500p

| FeFET | |
|---|---|
| Program Voltage | 3 |
| Stress same row | 1 |
| Stress same col | 1 |
| Stress deselected | -1 to 1 |

| Series FET | |
|---|---|
| Gate stress selected | 1 |
| Gate stress same row | -1 |
| Gate stress same col | 1 |
| Gate stress desel | -1 |

FIG. 5C

ERASE

| | Selected col | | | | Deselected col | | | |
|---|---|---|---|---|---|---|---|---|
| | BL | FeFETG | SFetG | SL | hidden B | BL | FeFETG | SFetG | SL | hidden B |
| Selected row | 3 | 0 | 2 | 2 | 2 | 1 | 1 | 0 | 2 | 1 | 1 | 1 |
| Deselected row | 3 | 2 | 2 | 2 | 2 | 1 | 1 | 2 | 2 | 1 | 1 | 1 |

| FeFET | |
|---|---|
| Program Voltage | -3 to -2 |
| Stress same row | -1 |
| Stress same col | -1 to 0 |
| Stress deselected | 1 |

| Series FET | |
|---|---|
| Gate stress selected | 0 |
| Gate stress same row | 1 |
| Gate stress same col | 0 |
| Gate stress desel | 1 |

FIG. 5D

READ — 500r

| | All cols | | | |
|---|---|---|---|---|
| | BL | FeFetG | SFetG | SL | B |
| Selected row | 0.5 | 1 | DAC | 0 | 0 |
| Deselected row | 0.5 | 0 | 0 | 0 | 0 |

FIG. 5E

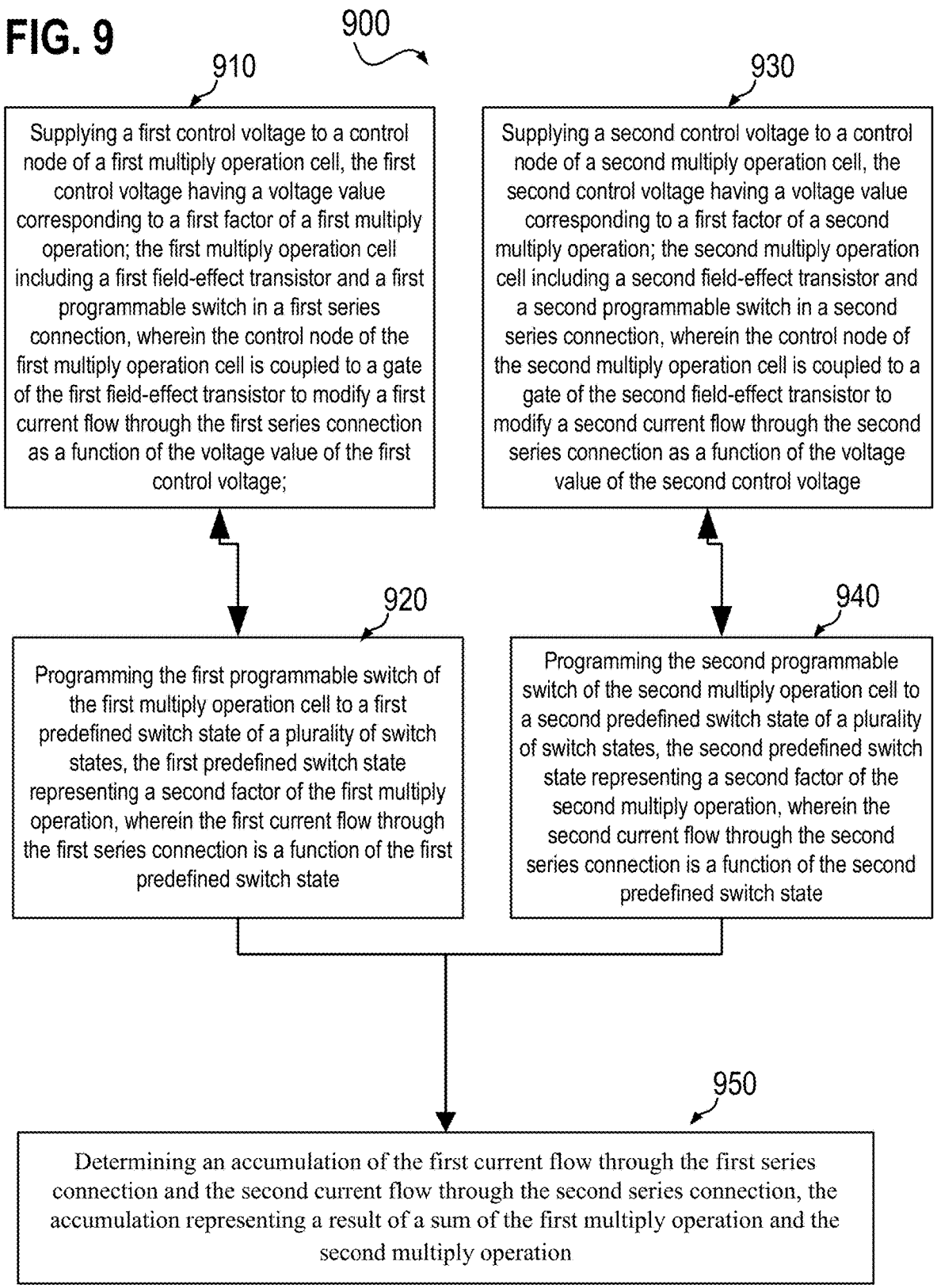

MULTIPLY OPERATION CIRCUIT, MULTIPLY AND ACCUMULATE CIRCUIT, AND METHODS THEREOF

TECHNICAL FIELD

Various aspects relate to a multiply operation circuit, a multiply and accumulate circuit, and methods thereof, e.g., a method for operating a multiply operation circuit and a method for operating a multiply and accumulate circuit. The multiply operation circuit and/or the multiply and accumulate circuit may be included in an electronic device or at least a part of an electronic device, e.g., a computing circuit, a computing system, and methods thereof.

BACKGROUND

In general, various electronic devices have been developed to allow for an in-memory computing. In-memory computing (IMC) may include computing strategies that can significantly increase computing speed. Data volumes and computing requirements of many applications (e.g., artificial intelligence applications, data analyses applications, data transaction applications, as examples) may require or benefit from IMC architectures. An aspect of in-memory computing may include an implementation of a multiply and accumulate (MAC) function also referred to as multiply and accumulate (MAC) operation. In computing technology, a MAC operation may be implemented to compute a product of two or more numbers and to add the product to an accumulator. The software and/or hardware that may perform a multiply and accumulate (MAC) operation may be referred to as a multiplier and accumulator (MAC, MAC device, MAC circuit, or MAC system).

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 4A to FIG. 4E show schematically various aspects of a multiply operation circuit and/or a multiply and accumulate operation;

FIG. 5A to FIG. 5E show schematically various aspects of a multiply and accumulate circuit and/or operating a multiply and accumulate circuit;

FIG. 9 shows a schematic flow diagram of a method for operating a set of multiply operation cells, according to various aspects.

DESCRIPTION

Figure 1:
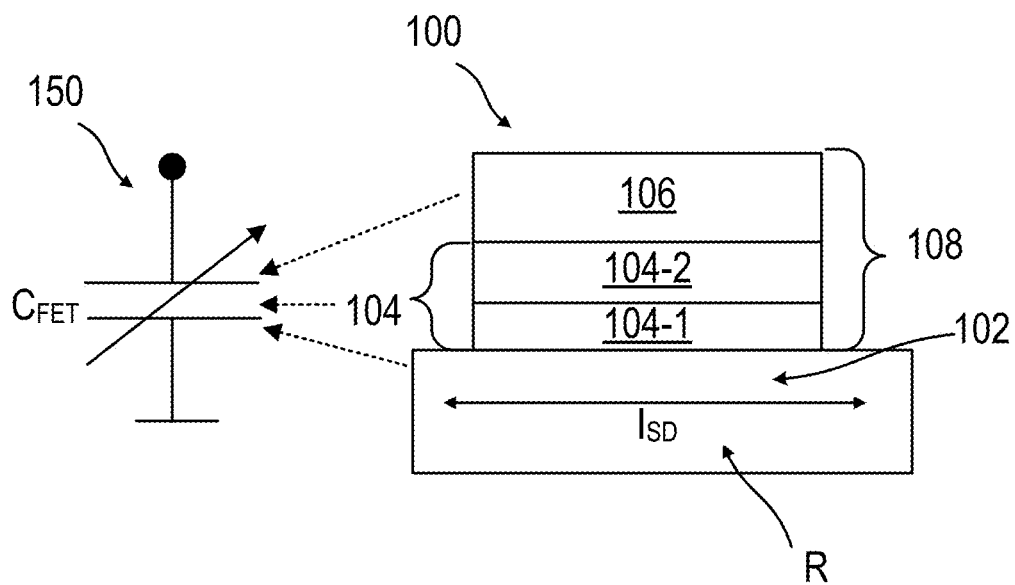
FIG. 1 shows schematically a field-effect transistor, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory capacitor). However, it may be understood that aspects described in connection with methods may similarly apply to the devices, and vice versa.

Various aspects may be related to an operation cell or a plurality of operation cells that may be configured to allow for a multiply operation and/or a multiply and accumulate operation, each operation cell including (e.g., consisting of) a field-effect transistor and a switch, preferably a programmable switch such as a ferroelectric field-effect transistor. The multiply operation may be carried out by influencing a current flow through a series connection of the field-effect transistor and the switch (i.e., the current flow through the operation cell). The electrically characteristic of the field-effect transistor (e.g., a subthreshold current flow through the field-effect transistor) represents a first factor of the multiply operation controlled by setting a corresponding control voltage supplied to the gate of the field-effect transistor. The setting of the corresponding control voltage may be based on a digital input, such that the voltage value of the corresponding control voltage and as a consequence a current flow through the field-effect transistor represents a digital value of the digital input. The electrically characteristic of the switch (e.g., a current flow through the switch) represents a second factor of the multiply operation controlled by setting a corresponding switch state of the switch. The accumulation operation and thus the multiply and accumulate operation may be realized by providing a set of operation cells coupled in parallel with respect to one another between two control lines. Thus, the sum of the current flows through the operation cells may be represented by a current flow in one or both of the two control lines. This sum of the current flows may be converted into a digital output value to allow a further processing of the result of the multiply and accumulate operation.

According to various aspects, a functional layer of a switch may include or may be made of a polarizable material, e.g., a spontaneously polarizable material (such as an anti-ferroelectric and/or ferroelectric material, as example). An anti-ferroelectric material may show a hysteresis in the (voltage dependent) polarization, however, with no remanent polarization remaining in the case that no voltage drops over the anti-ferroelectric material. A ferroelectric material may show a hysteresis in the (voltage dependent) polarization, however, with a remanent polarization remaining in the case that no voltage drops over the ferroelectric material. A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristics of the polarization) may be analyzed using capacity spectroscopy, e.g., via a static (C-V) and/or time-resolved measurement or by polarization-voltage (P-V) or positive-up-negative-down (PUND) measurements.

The term "spontaneously polarizable material" or "spontaneous-polarizable material" may be used herein with reference to a material that has a polarization capability in addition to its dielectric polarization capability. A spontaneously-polarizable material may be or may include a spontaneously-polarizable material that shows a remanence, e.g., a ferroelectric material, and/or a spontaneously-polarizable material that shows no remanence, e.g., an anti-ferroelectric material.

The term "remanently polarizable" or "remanent-polarizable" with reference to a layer, a portion, a structure, a memory cell, as examples, may be understood as a layer that exhibits a remanent-polarization capability (e.g., in addition to a dielectric polarization capability and/or a non-remanent-polarization capability). A remanent-polarizable layer, a remanent-polarizable structure, a remanent-polarizable memory cell, remanent-polarizable portion (only as examples) may include, in some aspects, a material that is remanently polarizable (i.e. that shows a remanence of the spontaneous polarization), e.g., a ferroelectric material. In other aspects, a remanent-polarizable layer, a remanent-polarizable structure, a remanent-polarizable memory cell, remanent-polarizable portion (only as examples) may include, in some aspects, a material that is spontaneously polarizable and that shows no remanence, e.g., an anti-ferroelectric material under the additional conditions, that measures are implemented to generate an internal electric-field within the anti-ferroelectric material. An internal electric-field within an anti-ferroelectric material may be caused (e.g., applied, generated, maintained, as examples) by various aspects, e.g., by implementing floating nodes that may be charged to voltages different from zero volts, e.g., by implementing charge storage layers, e.g., by using doped layers, e.g., by using electrode layers that adapt electronic work-functions to generate an internal electric field, only as examples.

In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. The remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Various aspects are related to a field-effect transistor and a switch. It is noted that various technologies, e.g., semiconductor technology based on silicon or any other semiconducting material (e.g., a semiconducting organic material, e.g., a carbon based material, as examples) are suitable to implement any desired field-effect transistor and any desired switch. Only as an example, a typical field-effect transistor (FET) and a combination of a field-effect transistor and a ferroelectric capacitor (FeCAP) are described in the following as examples for a possible implementation of a field-effect transistor and a switch. The combination of a FET and a FeCAP (e.g., a FeCAP having one of its electrodes coupled to a gate of the FET or a FeCAP integrated into a gate of a FET) may be referred to as ferroelectric field-effect transistor (FeFET).

FIG. 1 shows a schematic functioning of a field-effect transistor 100, according to various aspects. The field-effect transistor 100 may include a gate structure 108 (e.g., including one or more gate layers), wherein the gate structure 108 may include a gate isolation 104 (e.g., including one or more isolation layers) and a gate electrode 106 (e.g., including one or more electrode layers). The gate structure 108 is illustrated exemplarily as a planar gate stack, however, it may be understood that the planar configuration shown in FIG. 1 is an example, and other field-effect transistor designs may include a gate structure 108 with a non-planar shape, for example a trench gate transistor design, a vertical field-effect transistor design, or other designs. The gate structure 108 may define (e.g., be adjacent to) a channel region 102, e.g., provided in a semiconductor region (e.g., in a semiconductor layer, in a semiconductor die, etc.). The gate structure 108 may allow for a control of an electrical behavior (e.g., resistance) of the channel region 102. The gate structure 108 may, for example, be used to control (e.g., allow or prevent) a current flow in the channel region 102. In some aspects, the gate structure 108 may, for example, allow to control (e.g., allow or prevent) a source/drain current, $I_{SD}$, from a first source/drain region of the field-effect transistor 100 to a second source/drain region of the field-effect transistor 100. The source/drain regions are provided in or adjacent to the channel. The channel region 102 and the source/drain regions may be formed, e.g., via doping one or more semiconductor materials or by the use of intrinsically doped semiconductor materials, within a layer and/or over a layer. In some aspects, the gate structure 108 may control (e.g., increase or reduce) an electrical resistance, R, of the channel region 102 and, accordingly, control the amount of current that may flow through the channel region 102. With respect to the operation of the field-effect transistor 100, a voltage may be provided at (e.g., supplied to) the gate electrode 106 to control the current flow, $I_{SD}$, in the channel region 102, the current flow, $I_{SD}$, in the channel region 102 being caused by voltages supplied via the source/drain regions.

The gate electrode 106 may include an electrically conductive material, for example, polysilicon, a metal (e.g., aluminum), etc. In some aspects, the gate electrode 106 may include any suitable electrically conductive material, e.g., a metal, a metal alloy, a degenerate semiconductor (in other words a semiconductor material having such a high level of doping that the material acts like a metal and not anymore semiconducting). According to various aspects, the gate electrode 106 may include one or more electrically conductive portions, layers, etc. The gate electrode 106 may include, for example, one or more metal layers (also referred to as a metal gate), one or more poly silicon layers (also referred to as poly-Si-gate), etc. A metal gate may include, for example, at least one work-function adaption metal layer disposed over the gate isolation 104 and an additional metal layer disposed over the work-function adaption metal layer. A poly-Si-gate may be, for example, p-type doped or n-type doped.

According to various aspects, the gate isolation 104 may be configured to provide an electrical separation of the gate electrode 106 from the channel region 102 and further to influence the channel region 102 via an electric field generated by the gate electrode 106. The gate isolation 104 may include one or more electrically insulating portions, layers, etc., as described in more detail below.

Some examples of the gate isolation 104 may include at least two (e.g., two or more) layers (also referred to as gate isolation layers) differing in their material from each other. The at least two gate isolation layers may include, for example, a first gate isolation layer 104-1 (e.g., a first dielectric layer including a first dielectric material) and a second gate isolation layer 104-2 (e.g., a second dielectric layer including a second dielectric material distinct from first dielectric material). The second gate isolation layer 104-2 may be disposed over the first gate isolation layer 104-1. Illustratively, the first gate isolation layer 104-1 may be disposed closer to the channel region 102 of the field-effect transistor 100 compared to the second gate isolation layer 104-2. The first gate isolation layer 104-1 may be disposed directly on the channel region 102 and may provide an interface for forming the second gate isolation layer 104-2. In some aspects, the first gate isolation layer 104-1 may be referred to as buffer layer.

As illustrated by the circuit equivalent 150 in FIG. 1, a first capacitance, $C_{FET}$, may be associated with the field-effect transistor 100. Illustratively, the channel region 102, the gate isolation 104, and the gate electrode 106 may provide the first capacitance, $C_{FET}$, associated therewith, originating from the more or less conductive regions (the channel region 102 and the gate electrode 106) separated from one another by the gate isolation 104. Regarding the first capacitance, $C_{FET}$, illustratively, the channel region 102 may be considered as a first capacitor electrode, the gate electrode 106 as a second capacitor electrode, and the gate isolation 104 as a dielectric medium disposed between the first and second capacitor electrodes. The first capacitance, $C_{FET}$, of the field-effect transistor 100 may define one or more operating properties of the field-effect transistor 100. The configuration of the field-effect transistor 100 (e.g., of the gate isolation 104) may be adapted according to a desired behavior or application of the field-effect transistor 100 during operation (e.g., according to a desired capacitance), as described in further detail below.

According to various embodiments, a switch (also referred to as switch element), e.g., a programmable switch, e.g., a non-volatile switch, may be provided, for example, by coupling the gate structure 108 of the field-effect transistor 100 with a capacitive memory structure, or by integrating a capacitive memory structure in the gate structure 108 of the field-effect transistor.

Figure 2:
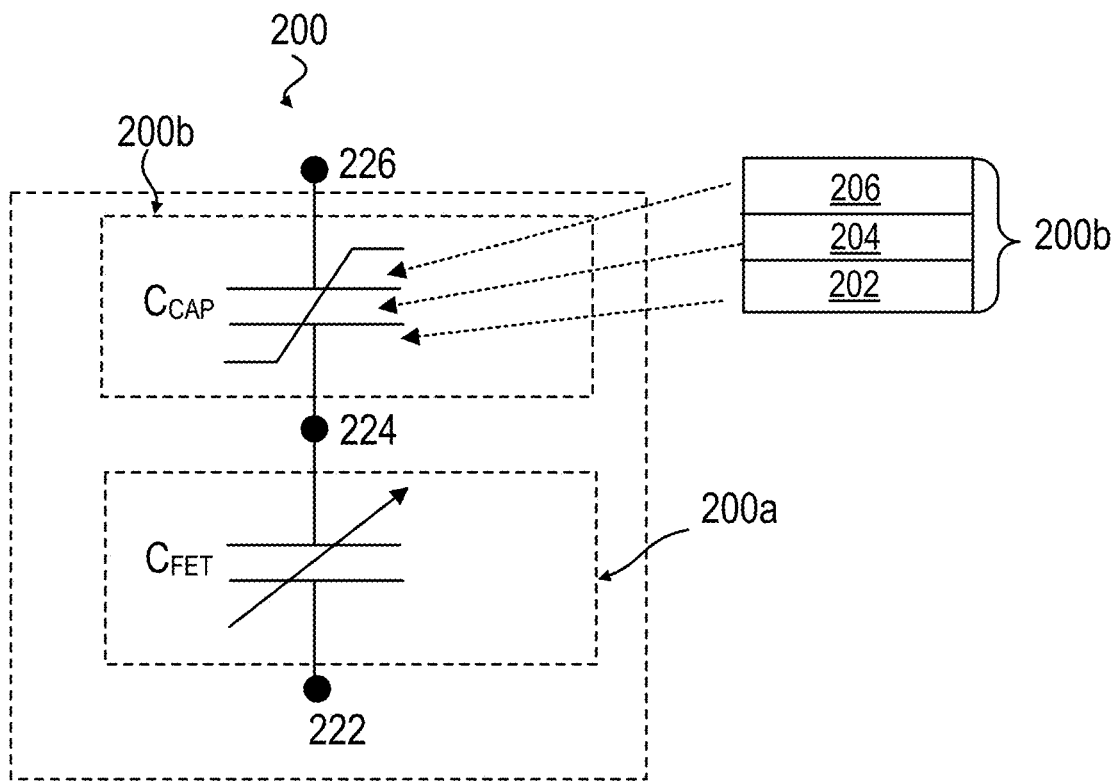
FIG. 2 shows schematically a programmable switch, according to various aspects.

FIG. 2 shows a circuit equivalent of a programmable switch 200 including a field-effect transistor structure 200a (e.g., configured as described here with reference to the field-effect transistor 100) and a capacitive memory structure 200b, according to various aspects. The field-effect transistor (FET) structure 200a may have a first capacitance, $C_{FET}$, associated therewith and the capacitive memory structure 200b may have a second capacitance, $C_{CAP}$, associated therewith. The field-effect transistor structure 200a and the capacitive memory structure 200b may be coupled (e.g., electrically connected) to one another such that a capacitive voltage divider is provided. The channel or bulk node of the field-effect transistor structure 200a may provide or may be connected to a first node 222 (according to various aspects, provided as or also referred to as terminal 222), an electrode of the capacitive memory structure 200b may provide or may be connected to a second node 226 (according to various aspects, provided as or also referred to as terminal 226) and an intermediate conductive portion (e.g., electrode, layer, etc.) may provide or may be connected to a floating intermediate node 224.

The capacitive voltage divider formed by the field-effect transistor structure 200a and the capacitive memory structure 200b may allow adapting the capacitances $C_{FET}$, $C_{CAP}$ of the respective capacitors to allow an efficient programming of the capacitive memory structure 200b. The overall gate voltage required for switching the programmable switch 200 from one memory state into another memory state (e.g. from high threshold voltage state to low threshold voltage state) may become smaller in case the voltage distribution across the field-effect transistor structure 200a and the capacitive memory structure 200b is adapted such that more of the applied gate voltage drops across the functional layer of the capacitive memory structure 200b (e.g., across a remanent-polarizable layer, such as a ferroelectric layer) than across the gate isolation of the field-effect transistor structure 200a. The overall write voltage (illustratively, applied via the nodes 222, 226 to which the field-effect transistor structure 200a and the capacitive memory structure 200b are connected) may thus be reduced by adapting the capacitive voltage divider. The voltage distribution may be determined by voltage divider calculations for a series connection of the capacitors.

That is, in case the capacitance, $C_{FET}$, of the field-effect transistor structure 200a is adapted (e.g., by providing a suitable gate isolation) a predefined fraction of the voltage applied to the series connection may drop across the capacitive memory structure 200b. Accordingly, the electric field generated across the gate isolation of the field-effect transistor structure 200a underneath the capacitive memory structure 200b could be reduced, if desired. This may lead to a reduced interfacial field stress, which may lead to a reduced wear out of the interface due to, for example, charge injection. Therefore, the reduced electric field generated across the gate isolation may lead to improved endurance characteristics of the programmable switch 200, that is, to an increased amount of possible polarization reversals until the programmable switch 200 may lose or change its memory properties.

In some aspects, the capacitive memory structure 200b may include a first electrode 202, a second electrode 206, and a function layer (e.g., a memory layer) 204 disposed between the first electrode 202 and the second electrode 206. The functional layer of the capacitive memory structure 200b may be a remanent-polarizable layer. By increasing the capacitance $C_{FET}$ of the field-effect transistor structure 200a (e.g., by providing a gate isolation including a relatively thick layer of material with high dielectric constant), the depolarization field, $E_{Dep}$, of the remanent-polarizable layer may be reduced. The capacitive memory structure 200b is illustrated exemplarily as a planar layer stack, however, it may be understood that the planar configuration shown in FIG. 2 is an example, and other capacitive memory structure designs may include one or more electrodes and/or one or more functional layers with a non-planar shape, for example a trench design.

According to various aspects, a capacitive memory structure 200b having a remanent-polarizable layer (e.g., a layer of a remanently polarizable material, also referred to as ferroelectric material) may be referred to as ferroelectric capacitor and a programmable switch 200 including a ferroelectric capacitor and a field-effect transistor may be referred to as ferroelectric field-effect transistor (FeFET).

In the following, various examples and aspects of a multiply operation circuit and/or a multiply and accumulate circuit are described that may include one or more aspects described above with reference to the field-effect transistor 100 and the programmable switch 200. However, it is emphasized that various different types of field-effect transistors and/or switches may be generally suited to implement the various functions described with reference to the multiply operation circuit and/or the multiply and accumulate circuit and/or methods thereof.

According to various aspects, a key function to perform in-memory computing (IMC) may be a realization of a multiply function and/or a multiply and accumulate function (MAC). Such functions may be implemented digitally, in general aspects; however, for an artificial intelligence (AI) application a digital MAC may deliver unnecessary precision at the cost of a considerable amount of electric power and therefore heat generation and energy loss.

According to various aspects, a multiply operation cell is proposed including a combination of a field-effect transistor (FET), e.g., a p-FET or an n-FET, and a programmable switch (e.g., a FeFET) to create, for example, a 2-dimensional array implementing an analog multiply function and/or an analog multiply and accumulate function.

According to various aspects, the use of a programmable switch based on a field-effect transistor type (e.g., a FeFET) may allow for a realization of large arrays including hundreds or more than one thousand multiply operation cells with comparable low electric losses due to leakage currents. A conventional memristors, for example, may have a resistance range to which they may be programmable in the order of few tens of kOhm's and as such, it may be difficult to limit the currents flowing in an array unless very small voltages are used. Large currents would cause IR drops (voltage drops) on the lines that may limit the maximum size of arrays that can be efficiently used for MAC operations.

According to various aspects, using a three-terminal device (like a FeFET) as an operation cell may bring a great improvement, virtually eliminating the current at least in one of the sides of the array, as the gate terminal is not drawing any current. However, the use of a FeFET array to implement an analog MAC may introduce limitations on precision due to difficulties in controlling the FeFET voltage threshold. According to various aspects, a multiply operation cell is provided that includes (e.g., consists of) two separated elements. A first element of the multiply operation cell may be a FeFET or another suitable structure that is used as a switch, for which the exact threshold voltage may be of less importance as long as at least two switch states can be distinguished in a reliable way, e.g., a low threshold voltage state and a high threshold voltage state of a FeFET can be programmed, stored, and/or distinguished from one another with high accuracy and reliability. A second element of the multiply operation cell may be a standard n-FET or p-FET, e.g., a logic FET, which has a much more controlled threshold voltage. Given the stability of the threshold voltage of this second element, it may be possible to drive the gate voltage of the FET in a subthreshold region, obtaining, for example, current levels in the nano-ampere range (e.g., in the range from about 1 nA to about 1000 nA).

According to various aspects, an analog input voltage may be applied directly to a gate of the field-effect transistor due to its accurate voltage threshold. In contrast, driving directly a gate of a FeFET would take splitting an n-bit input value into n-lines that would require more power and time to complete the operation compared to the two element operation cell described herein. Furthermore, even splitting the n-bit input into n-lines, the lack of accuracy in the threshold placement would still cause accuracy degradation.

According to various aspects, it may be possible to use the FET (e.g., an n-FET) as a shared element across multiple control-lines, which would be selected sequentially one at a time, obtaining array area savings.

Various aspects are related to an array of operation cells, each operation cell of the array of operation cells includes (e.g., substantially consists of) a FeFET (as a switch) and a FET, e.g., an n-FET, which enables the implementation of a power efficient analog multiply and/or accumulate function. According to various aspects, the operation cells may be configured to operate with operating currents in the nano-ampere range (e.g., with operating currents less than 100 nA), without requiring additional resistors or a use of very low voltages. Instead, input voltages can be used which remain in the hundreds of mV range, e.g., in the range from about 100 mV to about 1 V. According to various aspects, input voltages may be used in the range from about 10 mV to about 1 V.

According to various aspects, the operation cells may be configured such that substantially no voltage drops on word lines (e.g., the control lines coupled to gate terminals of the FETs), and that a comparatively small voltage drops on bit lines (e.g., the control lines coupled to an output terminal of the switch, e.g., to a source/drain terminal of a FeFET that is used as the switch) allowing one-shot calculation of arrays with large numbers of coefficients.

The accuracy of the FET threshold may allow for a direct drive of the input with precisions of several bits. The programming of the high threshold or low threshold of the FeFET is made possible by driving the three accessible terminals of the FeFET (source terminal, body terminal, gate terminal) while the 4th terminal is either left floating or driven with a FET Vth or bipolar Vth drop.

In principle, the analog voltage could be applied directly on the FeFET such that the FET may be omitted in the operating cell; however, it was found that the FeFET threshold may not have a sufficiently high accuracy to operate an array of such operation cells.

According to various aspects, the array of operation cells may be configured such that one FET is shared with multiple FeFETs in case the analog operation is not evaluated in one shot but in multiple steps (the shared FETs would always be active while rows of FeFETs would be activated one at a time).

Figure 3:
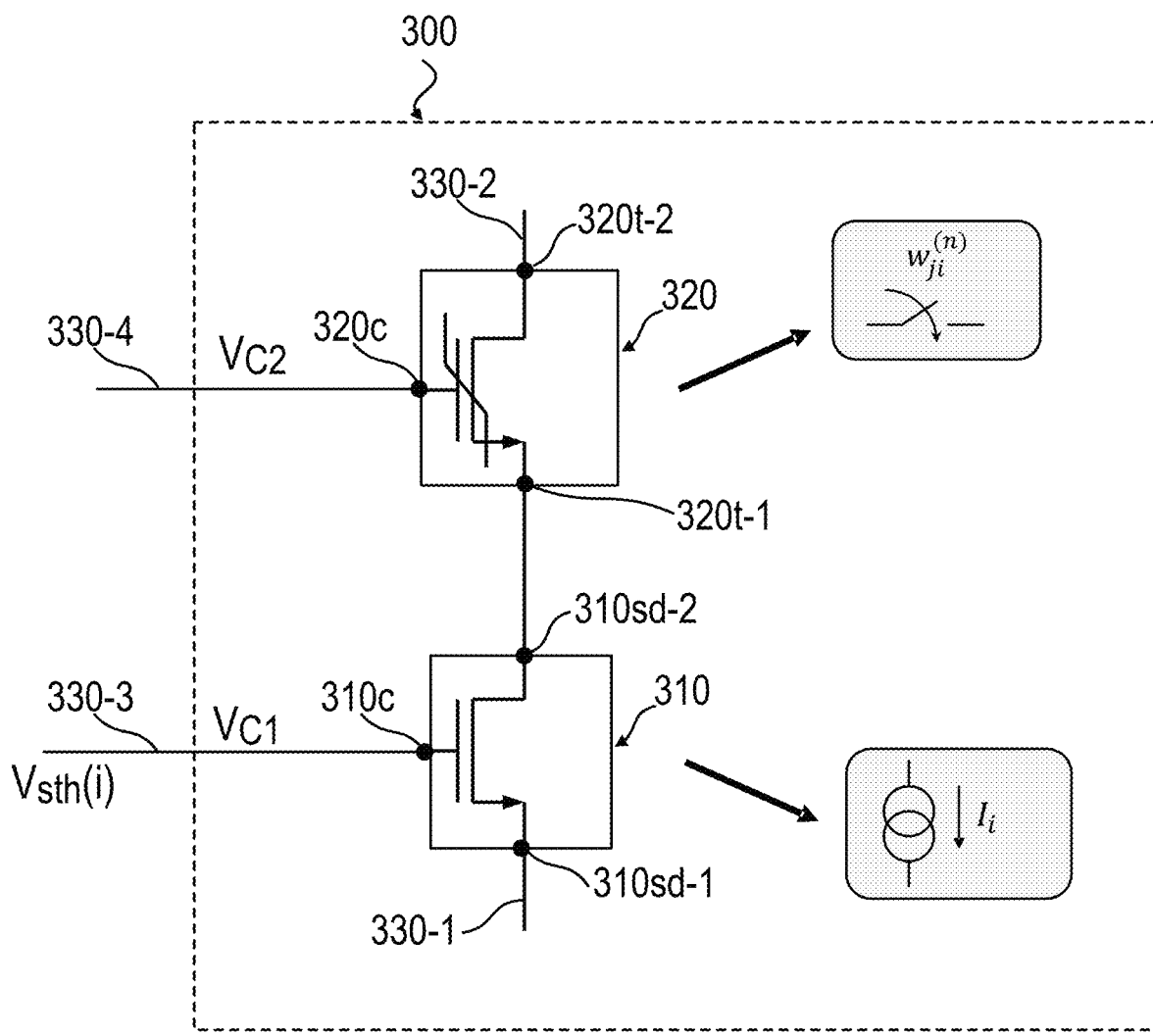
FIG. 3 shows schematically a multiply operation circuit, according to various aspects.

FIG. 3 shows a multiply operation circuit 300 in a schematic view, according to various aspects. The multiply operation circuit 300 may include a field-effect transistor 310 and a switch 320. According to various aspects, the multiply operation circuit 300 may be used as an operation cell in a multiply and accumulate function (MAC) circuit or any other implementation of a multiply and accumulate function, see, for example, FIGS. 4A to 4E.

According to various aspects, the field-effect transistor 310 may have a first source/drain terminal 310*sd*-1, a second source/drain terminal 310*sd*-2, and a control terminal 310*c*. The first source/drain terminal 310*sd*-1 of the field-effect transistor 310 may be coupled (e.g., electrically conductively connected) to a first control line 330-1. The switch 320 may have a first terminal 320*t*-1, a second terminal 320*t*-2, and a control terminal 320*c* to change a switch state of the switch 320 between at least two switch states associated with the switch 320. The first terminal 320*t*-1 of the switch 320 may be coupled (e.g., electrically conductively connected) to the second source/drain terminal 310*sd*-2 of the field-effect transistor 310. The second terminal 320*t*-2 of the switch 320 may be coupled (e.g., electrically conductively connected) to a second control line 330-2.

Furthermore, the control terminal 310c of the field-effect transistor 310 may be coupled (e.g., electrically conductively connected) to a third control line 330-3 and the control terminal 320c of the switch 320 may be coupled (e.g., electrically conductively connected) to a fourth control line 330-4. According to various aspects, the first control line 330-1, the second control line 330-2, the third control line 330-3, and the fourth control line 330-4 may be coupled (e.g., electrically conductively connected) to one or more input/output circuits to operate the multiply operation circuit 300.

According to various aspects, the field-effect transistor 310 and the switch 320 may be configured to control a current flow ($I_t$) between the first control line 330-1 and the second control line 330-2 as a function of both a first control voltage ($V_{C1}$) provided at the control terminal 310c of the field-effect transistor 310 (e.g., provided via the third control line 330-3 to the field-effect transistor 310) and a second control voltage ($V_{C2}$) provided at the control terminal 320c of the switch 320 (e.g., provided via the fourth control line 330-4 to the switch 320) in combination with a switch state in which the switch 320 is residing to realize a multiplication operation ($I_t$ times $w_{ji}(n)$). The first control voltage ($V_{C1}$ or $V_{sth}(i)$) may represent a first variable (e.g., a first factor) of the multiplication operation. According to various aspects, a response of the switch 320 upon the second control voltage ($V_{C2}$) may represent a second variable of the multiplication operation. In some aspects, an actual switch state in which the switch 320 may reside in may represent the second variable of the multiplication operation. In the case that a voltage controlled switch 320 is used, as illustrated in FIG. 3, the second control voltage ($V_{C2}$) may be a select voltage and the switch 320 may be, in response to the select voltage, in one of a plurality of switch states. The plurality of switch states may be influenced by a functional layer (e.g., a memory layer) included in the switch 320. As an examples, the switch 320 may be in a first switch state in the case that the select voltage is applied to the control terminal 320c of the switch 320 in the case that the functional layer is in a first state (e.g., a remanently polarizable layer may be in a first polarization state) and the switch 320 may be in a second switch state in the case that the select voltage is applied to the control terminal 320c of the switch 320 in the case that the functional layer is in a second state (e.g., a remanently polarizable layer may be in a second polarization state). Illustratively, the switch 320 may be a remanent (e.g., a remanently programmable) switch based on at least one memory layer included in the switch. The switch 320 may be a FeFET that can be written into at least a first memory state and a second memory state, wherein the memory states defined the switch states of the switch 320. According to various aspects, a switch state of the switch 320 may represent a second variable (e.g., a second factor) of the multiplication operation. The current flow ($I_t$) between the first control line and the second control line (i.e. between the first source/drain terminal 310sd-1 of the field-effect transistor 310 and the second terminal 320t-2 of the switch 320) may represent a product (in other words a result of the multiplication operation) of the first variable and the second variable.

According to various aspects, FIG. 3 illustrates a multiply operation circuit 300 including a three terminal switch 320, e.g., a voltage controlled switch. However, in the case that the switch is not voltage controlled, the switch 320 may include only two terminals, namely, the first terminal 320t-1 and the second terminal 320t-2.

In the following, various details are described with reference to a multiply operation circuit 300 and a realization of various MAC functions. As illustrated in FIG. 3, an electrical input current, $I_i$ (as a first variable of a multiply operation) may be associated with the current flow defined by the field-effect transistor 310 of each multiply operation circuit 300 and a weight factor, $w_{ji}$, (as a second variable of the multiply operation) may be associated with the switch state defined by the switch 320 of the multiply operation circuit 300.

Figure 4A:
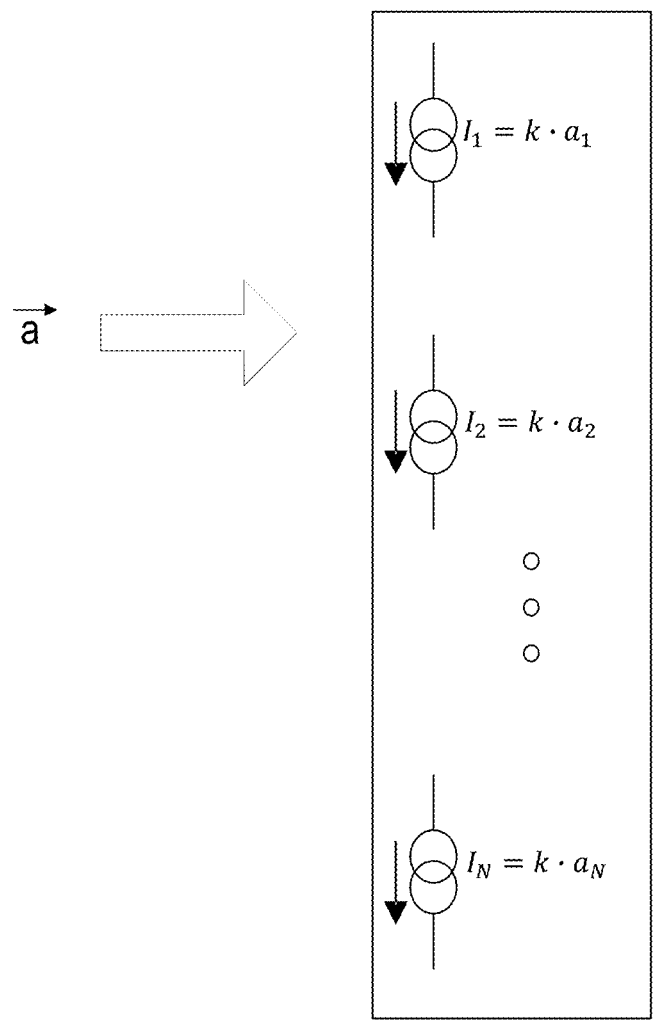

FIG. 4A illustrates various aspects of a MAC function, e.g., a generation of a number of N independent input currents $I_i=k*a_i$ based on an input vector $\vec{a}$, wherein $a_i$ denote the vector components of the input vector $\vec{a}$. The input vector $\vec{a}$ may be a given input for the desired MAC operation, e.g., provided from a layer of a neuronal network. The input currents $I_i$ are generated by applying a corresponding (e.g., subthreshold) voltage, $V_{sth}(i)$, to the gate of the field-effect transistor 310 of the multiply operation circuit 300, e.g., via the control terminal 310c of the field-effect transistor 310 and the third control line 330-3.

Figure 4B:
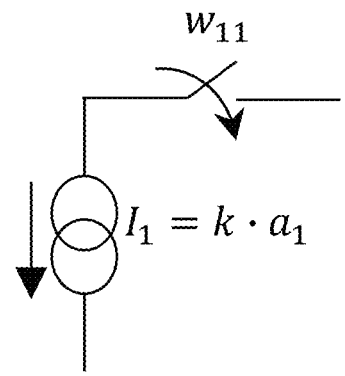
Figure 4B:
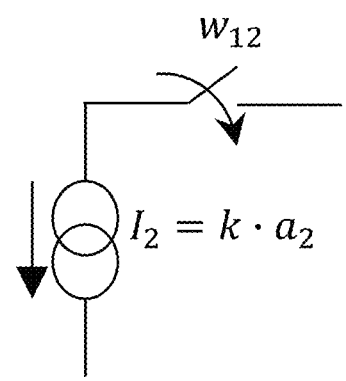
Figure 4B:
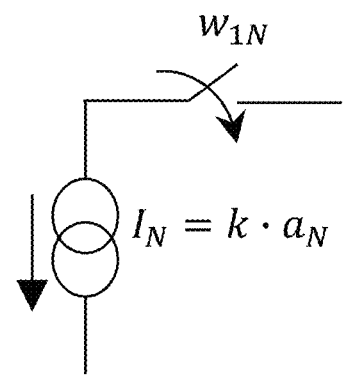

FIG. 4B illustrates various aspects of a MAC function, e.g., weight factors $w_{ji}$ that can be realized by the switch 320 of the multiply operation circuit 300. In the case that the weight factors $w_{ji}$ are of a size of 1-bit, they can be realized with a two-state switch (e.g., with a first switch state (1=closed) and a second switch state (0=open). In other cases, e.g., in the case that the weight factors $w_{ji}$ are of a size of 2-bit, they can be realized with a four-state switch, as examples.

In FIG. 4B there are N weight factors $w_{ji}$ illustrated for $j=1$, e.g., $w_{11}$ to $w_{1N}$, wherein each of the weight factors has a corresponding input current $I_i$, e.g., $I_1$ to $I_N$, in accordance with the associated multiply operation circuit 300. According to various aspects, the current through the series connection of the field-effect transistor 310 and the switch 320 of a respective multiply operation circuit 300 may represents a result or partial result of the MAC operation.

Figure 4C:
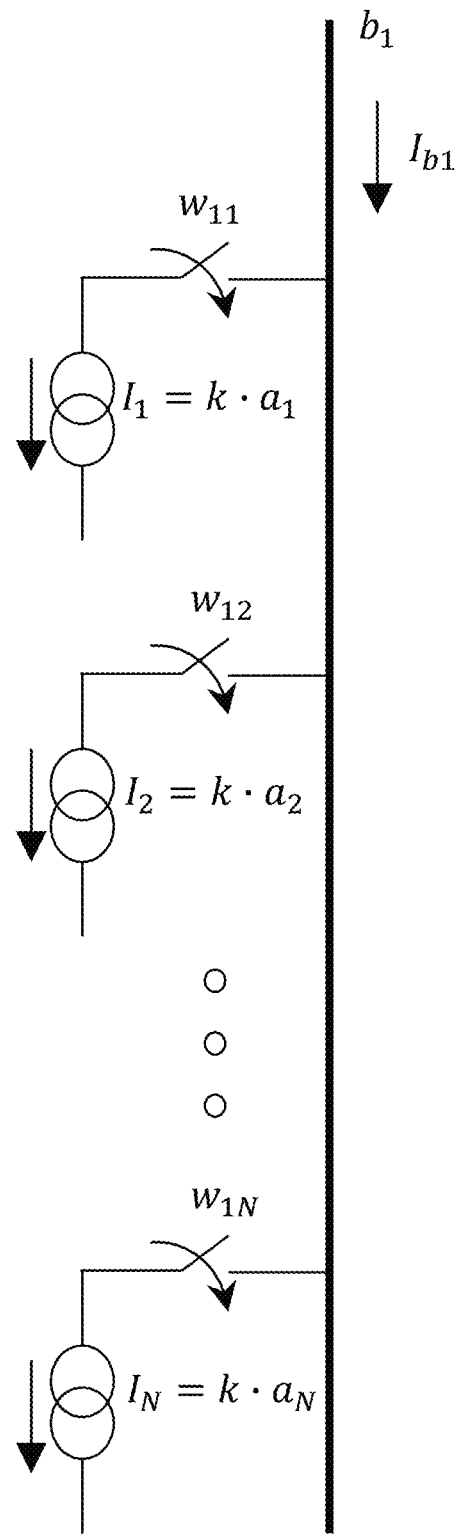

FIG. 4C illustrates various aspects of a MAC function, e.g., that on each $b_j$ line a total current $I_{bj}=\Sigma w_{ji} \cdot I_i$ can be generated (e.g., as the sum for $j=1$ and i ranging from 1 to N as illustrated) and determined. According to various aspects, the total current $I_{bj}=\Sigma w_{ji} \cdot I_i$ represents a result or partial result of the MAC operation. In an array including N times N (N×M) multiply operation circuits 300 (illustratively N×M operation cells), i may range from 1 to N and j may range from 1 to M to realize a MAC function, as illustrated in FIG. 4D.

According to various aspects, a weight factor $w_{ji}$ may be coded with n*b bits ($(w_{ji}^{(0)}, w_{ji}^{(1)} \ldots w_{ji}^{(n_b-1)})$ and may connect n*b replicas of the current $I_i$ to n*b lines, which represent the n*b bits of the output $b_j$, as illustrated in FIG. 4E. According to various aspects, for each output $b_j$ the sum current $I_j$ may be determined (e.g., calculated) as a weighted sum of the total currents $I_j^{(n)}$. According to various aspects, the sum current $I_j$ represents a result or partial result of the MAC operation.

According to various aspects, the control voltage $V_{sth}(i)$ provided to a respective multiply operation circuit 300 may represent and/or define a first variable of the multiplication operation, e.g., the respective input current $I_i$, and the switch of the respective multiply operation circuit 300 may represent and/or define a second variable of the multiplication operation, e.g., the respective weight factor $w_{ji}$, and wherein a current flow through the respective multiply operation circuit 300 represents a product of the first variable and the second variable.

Figure 4D:
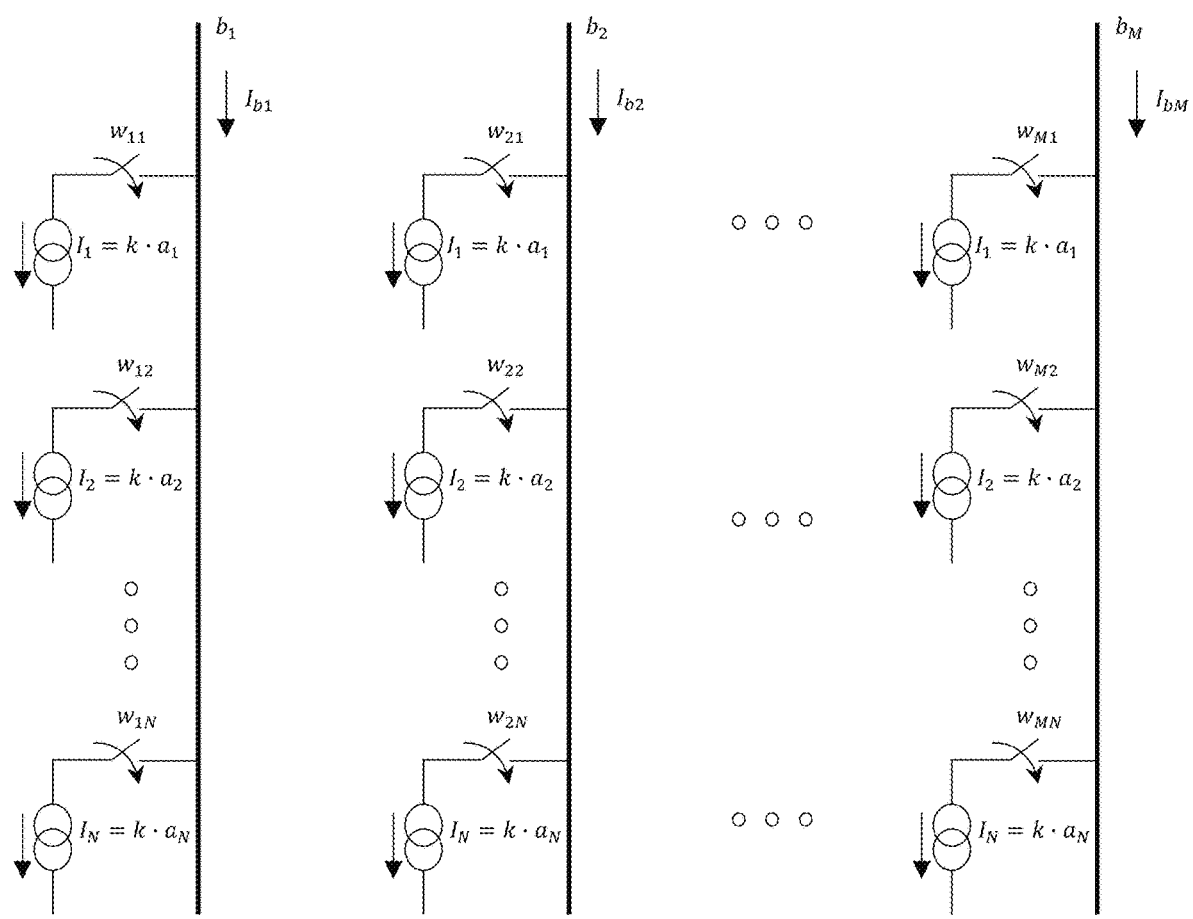

According to various aspects, a plurality of multiply operation circuits 300 may share a respective common control line (e.g., a common second control line, as illustrated in FIG. 4C to FIG. 4E, see $b_j$ for j=1 to j=M) such that current flows (e.g., the corresponding input currents $I_i$) of the plurality of multiply operation circuits accumulate to a total current flow (see total current $I_{bj}$ or $I_j^{(n_b-1)}$) on the common control line.

As illustrated in FIG. 4E, the total currents $I_{bj}$ or $I_j^{(n_b-1)}$ for j=1 to j=M may be merged to a sum current $I_j$, e.g., via a current merge circuit coupled to the common control lines.

According to various aspects, negative factors of the multiplication operation may be represented by implementing an additional array or additional lines in the same array in which negative currents are added (therefore representing a subtraction) when they come to the merge point.

According to various aspects, FIGS. 4C to 4E show a multiply and accumulate circuit in a schematic view, wherein a plurality of multiply operation cells (see i ranging from 1 to N and j ranging from 1 to M) are configured in a matrix arrangement (e.g., a N×M-Matrix). Each of the multiply operation cells may include a field-effect transistor and a programmable switch in a series connection, wherein the field-effect transistor and the programmable switch are configured to control a current flow through the respective multiply operation cell to realize a multiplication operation. All multiply operation cells of a first set of the plurality of multiply operation cells (e.g., the set may be defined by all multiply operation cell having the same value for j) share a corresponding control line to realize an accumulation operation.

Figure 5A:
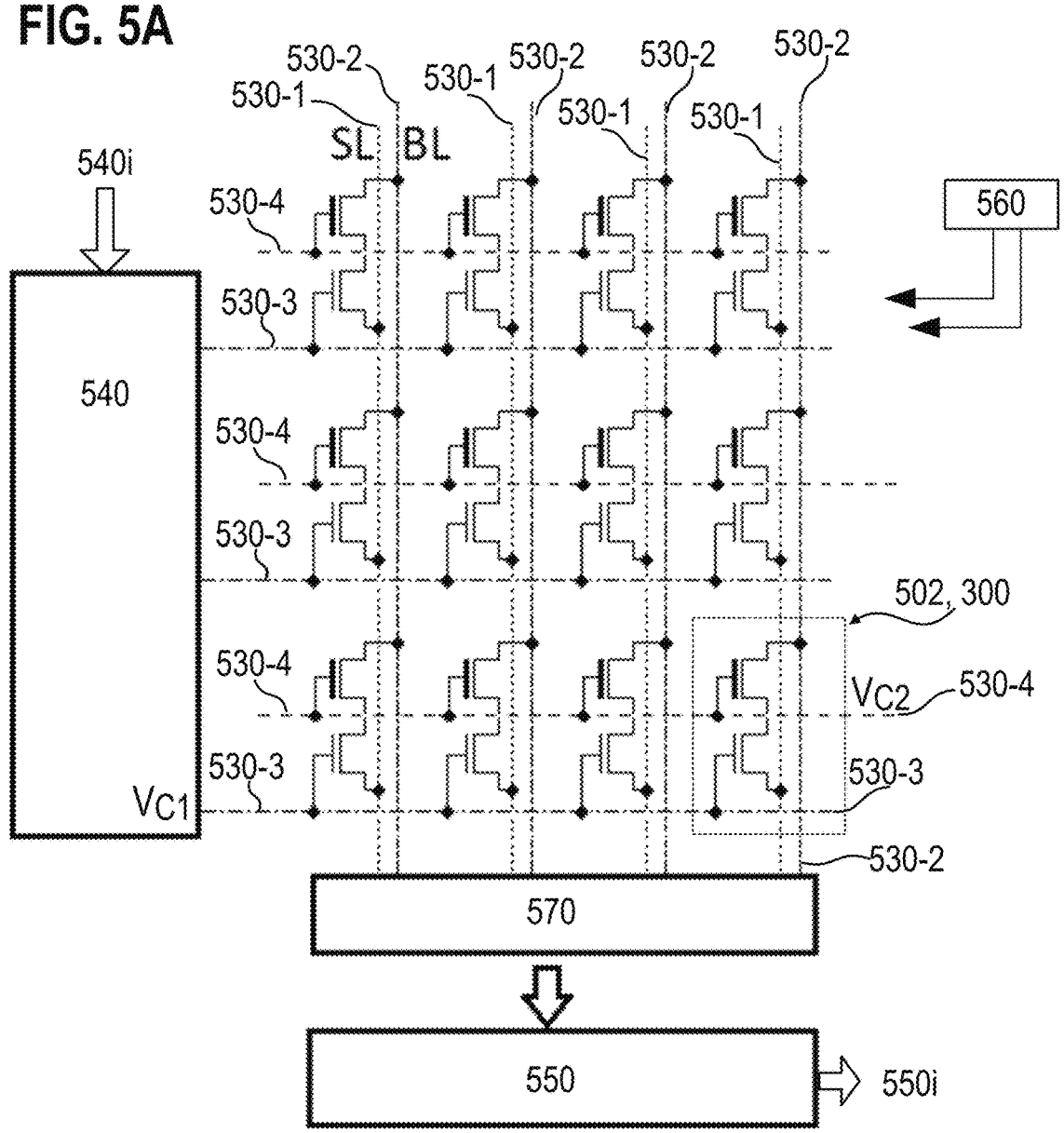
Figure 5B:
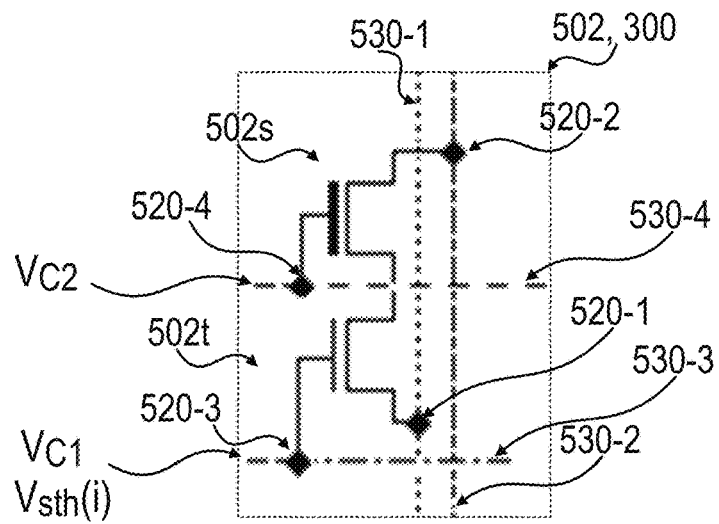

FIG. 5A shows a multiply and accumulate circuit 500 in a schematic view, according to various aspects. FIG. 5B shows a more details view of one of the operation cells 502 of the multiply and accumulate circuit 500, according to various aspects. The multiply and accumulate circuit 500 may include a plurality of multiply operation cells 502 configured in a matrix arrangement. Each of the multiply operation cells 502 may be configured as described herein with reference to the multiply operation circuit 300. FIG. 5A shows exemplarily operation cells 502, wherein each operation cell includes or consists of an n-FET 502t (as the field-effect transistor element of the operation cell 502) and a FeFET 502s (as the switch element of the operation cell 502). However, other configurations (e.g., a flash memory cell as a switch element) may be used in a similar way. According to various aspects, a use of n-FETs 502t may be, in some aspects, useful since they can be manufactured with a sufficient high precision such that a desired number of control voltages and resulting distinct input currents can be provided for the operation of the multiply and accumulate circuit 500. According to various aspects, a use of a Fe-FET may allow for an efficient programming due to its comparably low writing voltage (e.g., compared to a flash cell) and its low electric losses (compared to a phase-change memory (PCM) and/or a memristor).

According to various aspects, each multiply operation cell 502 of the plurality of multiply operation cells may include a field-effect transistor (e.g., an n-FET) 502t and a programmable switch (e.g., a FeFET 502s) in a series connection between a first control line node 520-1 and a second control line node 520-2 and controlled by a third control line node 520-3 coupled to the field-effect transistor and a fourth control line node 520-4 coupled to the programmable switch. The field-effect transistor and the programmable switch may be configured to control a current flow between the first control line node 520-1 and the second control line node 520-2 as a function of both a first control voltage provided ($V_{C1}$ or $V_{sth}(i)$) at the third control line node 520-3 and a response of the programmable switch to a second control voltage ($V_{C2}$) provided at the fourth control line node 520-4 to realize a multiplication operation. In similar aspects, the field-effect transistor and the programmable switch may be configured to control a current flow between the first control line node 520-1 and the second control line node 520-2 as a function of both a first control voltage provided ($V_{C1}$ or $V_{sth}(i)$) at the third control line node 520-3 and a switch state of the programmable switch to realize a multiplication operation.

According to various aspects, the first control voltage ($V_{C1}$ or $V_{sth}(i)$) may represent a first variable of the multiplication operation and the second control voltage ($V_{C2}$) and/or the switch state of the switch may represent a second variable of the multiplication operation and the current flow between the first control line node 520-1 and the second control line node 520-2 may represent a product of the first variable and the second variable.

According to various aspects, a respective multiply operation cell 502 of the plurality of multiply operation cells is configured to be individually operable by a first control line 530-1 of a set of first control lines (the set of first control lines is provided by all first control lines 530-1 of the multiply and accumulate circuit 500) coupled to the first control line node 520-1 of the respective multiply operation cell 502, a second control line 530-2 of a set of second control lines (the set of second control lines is provided by all second control lines 530-2 of the multiply and accumulate circuit 500) coupled to the second control line node 520-2 of the respective multiply operation cell 502, a third control line 530-3 of a set of third control lines (the set of third control lines is provided by all third control lines 530-3 of the multiply and accumulate circuit 500) coupled to the third control line node 520-3 of the respective multiply operation cell 502, and a fourth control line 530-4 of a set of fourth control lines (the set of fourth control lines is provided by all fourth control lines 530-4 of the multiply and accumulate circuit 500) coupled (e.g., electrically conductively connected) to the fourth control line node of the respective multiply operation cell 502.

According to various aspects, all multiply operation cells 502 of a respective first set of multiply operation cells of the plurality of multiply operation cells (e.g., N operation cells 502 of an array of N times M operation cells 502) share a corresponding common second control line 530-2, and all multiply operation cells 502 of a respective second set of multiply operation cells of the plurality of multiply operation cells (e.g., M operation cells 502 of an array of N times M operation cells 502) share a corresponding common third control line 530-3. Furthermore, in some aspects, all multiply operation cells 502 of the first set of multiply operation cells share a corresponding common first control line 530-1, and all multiply operation cells 502 of the second set of multiply operation cells share a corresponding common fourth control line 530-4.

FIGS. 5C to 5E show exemplarily voltage schemes 500p, 500e, 500r for operating the multiply and accumulate circuit 500, according to various aspects. FIG. 5C shows a voltage scheme 500p for programming a selected operation cell 502 (or, in other words, a FeFET 502s of a selected operation cell 502) of the multiply and accumulate circuit 500 (e.g., in terms of setting the programmable switch to a first switch state). FIG. 5D shows a voltage scheme 500e for erasing a selected operation cell 502 (or, in other words, a FeFET 502s of a selected operation cell 502) of the multiply and accumulate circuit 500 (e.g., in terms of setting the programmable switch to a second switch state). FIG. 5E shows a voltage scheme 500r for reading operation cells 502 of the multiply and accumulate circuit 500 (e.g., in terms of performing a MAC operation).

The operation cell 502 (or, in other words, the FeFET 502s of the operation cell 502) to be programmed may have a column and a row of the matrix arrangement associated therewith, namely the selected row and the selected column. All other operation cells 502 (or, in other words, all other FeFETs 502s of the other operation cell 502) not to be programmed, may have at least another column and/or another row of the matrix arrangement associated therewith, namely the deselected row and/or the deselected column. The rows of the matrix arrangement may be associated with the control variable i (ranging from 1 to N) and the columns of the matrix arrangement may be associated with the control variable j (ranging from 1 to M), as described with reference to FIGS. 4A to 4E.

With respect to the denotations shown in the FIGS. 5C to 5E, the following is noted. The term "BL" denotes bit-lines, e.g., the respective common second control lines 530-2 of the multiply and accumulate circuit 500. The term "SL" denotes source-lines, e.g., the respective common first control lines 530-1 of the multiply and accumulate circuit 500. The term "FeFetG" denotes gates of the FeFETs 502s of the multiply and accumulate circuit 500, e.g., addressed by the corresponding common fourth control lines 530-4. The term "SFetG" denotes gates of the FETs 502t of the multiply and accumulate circuit 500, e.g., addressed by the corresponding common third control lines 530-4. The term "B" denotes a body voltage of the FETs 502t and the FeFETs 502s (e.g., applied at each body terminal of the FETs 502t and the FeFETs 502s) of the multiply and accumulate circuit 500.

The integer values denote a voltage value with reference to VPP/3 quantities, wherein VPP is a writing (programming and erase) voltage of the FeFETs 502s of the operation cells 502, e.g., the integer value 0 denotes a voltage of zero, the integer value 1 denotes a voltage of 1/3 VPP, the integer value 2 denotes a voltage of 2/3 VPP, the integer value 3 denotes a voltage of 3/3 VPP (i.e., VPP).

The term "hidden" denotes a common node connecting the FET 502t and the FeFET 502s of a respective operation cell 502, e.g., the second source/drain terminal 310sd-2 of the field-effect transistor 310 and/or the first terminal 320t-1 of the switch 320 of the multiply operation circuit 300 may be such a common node. According to various aspects, the common node connecting the FET 502t and the FeFET 502s of a respective operation cell 502 may be addressed indirectly through the FET 502t of the respective operation cell 502, therefore it may be referred to herein as hidden node. The hidden node is floating as long as the FET 502t and the FeFET 502s of the respective operation cell 502 are closed. However, according to various aspects, the voltage at the hidden node of a selected operation cell 502 may be controlled during programming and/or erasing an operation cell 502 by applying a voltage at the gate of the FET 502t (referred to as SFetG) of the selected operation cell 502 and by applying a voltage at the SL of the selected operation cell 502 before applying the voltages in accordance with the respective voltage scheme 500p, 500e. During programming a selected operation cell 502, it may be desired to apply 2/3 VPP to the hidden node of operation cell 502 corresponding to the selected row and deselected columns, e.g., by applying 3/3 VPP at the gate of the FET 502t (referred to as SFetG) of the respective operation cells 502 and by applying 2/3 VPP at the SL of the respective operation cells 502. During erasing a selected operation cell 502, it may be desired to apply 2/3 VPP to the hidden node of operation cell 502 corresponding to the selected columns, e.g., by applying 3/3 VPP at the gate of the FET 502t (referred to as SFetG) of the respective operation cells 502 and by applying 2/3 VPP at the SL of the respective operation cells 502. During erasing a selected operation cell 502, it may be desired to apply 1/3 VPP to the hidden node of operation cell 502 corresponding to the deselected columns, e.g., by applying 3/3 VPP at the gate of the FET 502t (referred to as SFetG) of the respective operation cells 502 and by applying 1/3 VPP at the SL of the respective operation cells 502.

According to various aspects, to pass, for example, 2/3 VPP on the deselected column the series FET gate may be temporarily raised to full VPP during programming, or another suitable voltage to open the series FET. During this transient, SL may be temporarily raised to 2/3 VPP to reduce the stress on the series FET oxide. During the erasing, the stress mitigation timing may require the unselected SL to change between 2/3 VPP and 1/3 VPP. During the erase, the FeFET 502s of an operation cell 502 may not have the full VPP field, e.g., VPP may be applied on the drain side of the FeFET 502s and 2/3 VPP may be applied at the source side of the FeFET 502s.

As can be seen in FIG. 5C and FIG. 5D, the respective voltage schemes allow for a maximal stress for the FeFETs 502s and the FETs 502t of 1/3 VPP, which may increase durability of the multiply and accumulate circuit 500 and/or which may allow for a use of FeFETs 502s and/or FETs 502t with a smaller footprint.

The MAC operation of the multiply and accumulate circuit 500 may be referred to herein as read operation, as illustrated in FIG. 5E. The voltage scheme 500r for reading operation cells 502 may include charging the BL to 1/6 VPP (denoted by the 0.5 value). All columns may be selected columns and, for the selected row, a control voltage (denoted with DAC) may be supplied to the gate of the FET 502t (see SFetG), wherein the control voltage DAC defines the input current $I_i$ for the respective operation cell 502 (e.g., for all operation cells 502 that share the same common third control line 530-3.

According to various aspects, the multiply and accumulate circuit 500 may include a digital to analog converter (D-AC) 540. The digital to analog converter 540 may be coupled (e.g., electrically conductively connected) to the respective third common control lines 530-3. With reference to FIG. 3 it is noted that the digital to analog converter 540 may be coupled (e.g., electrically conductively connected) to the control terminal 310c of the field-effect transistor 310. The digital to analog converter 540 may be configured to convert a digital input signal 540i into an analog voltage or, in other words, into an analog voltage signal to provide the first control voltage VC1, $V_{sth}(i)$ to the respective third common control lines 530-3. With reference to FIG. 3 it is noted that the digital to analog converter 540 may be configured to convert a digital input signal 540i into an analog voltage or, in other words, into an analog voltage signal to provide the first control voltage VC1, $V_{sth}(i)$ to the control terminal 310c of the field-effect transistor 310. According to various aspects, a respective voltage value of the analog voltage signal represents a corresponding digital input value represented by the digital input signal 540i.

According to various aspects, the multiply and accumulate circuit 500 may include an analog to digital converter (A-DC) 550. The analog to digital converter 550 may be coupled (e.g., electrically conductively connected) to the respective second common control line 530-2. The analog to digital converter 550 may be configured to convert a current flow through the common second control line 530-2 into a digital output signal 550i. A respective digital output value of the digital output signal 550i may represent at least a result of the multiplication and accumulation operation. According to various aspects, the analog to digital converter 550 coupled (e.g., electrically conductively connected) to a respective common second control line 530-2 and configured to convert the total current flow $I_{bj}$ (see FIGS. 4C to 4E) through the common second control line 530-2 into a digital output signal 550i, wherein a respective digital output value of the digital output signal represents a sum of results of respective multiplication operations of the plurality of multiply operation circuits that share the respective common second control line 530-2.

According to various aspects, the multiply and accumulate circuit 500 may include one or more control circuits 560 (the digital to analog converter 540 and/or the analog to digital converter 550 may be part of the one or more control circuits or may be provided in addition to the one or more control circuits) coupled to the operation cells 502 of the multiply and accumulate circuit 500. With reference to FIG. 3 it is noted that the one or more control circuits may be coupled (e.g., electrically conductively connected) to the field-effect transistor 310 and the switch 320. The one or more control circuits 560 may be configured to provide a set of operation voltages (e.g., programing voltages, erase voltages, read voltages, see, for example, FIGS. 5C to 5E) to the operation cells 502 of the multiply and accumulate circuit 500. With reference to FIG. 3 it is noted that the one or more control circuits may be may be configured to provide a set of operation voltages to the first source/drain terminal 310sd-1, the second source/drain terminal 310sd-2, and the control terminal 310c of the field-effect transistor 310 and to the first terminal 320t-1, the second terminal 320t-2, and the control terminal 320c of the switch 320. The set of operation voltages may be configured to selectively bring the programmable switch into a predefined switch state of the at least two switch states (see, for example, FIGS. 5C and 5D). The set of operation voltages may be configured to operate the operation cell 502, e.g., to perform a MAC operation (see, for example, FIG. 5E). The MAC operation may be performed based on the digital input signal 540i and the digital output signal 550i represents a result of the MAC operation.

According to various aspects, the multiply and accumulate circuit 500 may include a current merge circuit 570. In some aspects, the current merge circuit 570 may be part of the one or more control circuits or may be provided in addition to the one or more control circuits 560. The current merge circuit 570 may be coupled (e.g., electrically conductively connected) to a plurality of (e.g., all of) the common second control lines 530-2. The current merge circuit 570 may be configured to output a merged current (e.g., a sum current $I_j$, see FIG. 4E) as a function of total current flows (e.g., a total currents $I_{b1}$ to $I_{bM}$) in the plurality of common second control lines 530-2.

As an examples, the multiply and accumulate circuit 500 may include a first common second control line shared by a first set of operation cells 502 and a second common second control line shared by a second set of operation cells 502, and the current merge circuit 570 may be coupled (e.g., electrically conductively connected) to the first common second control line and the second common second control line and configured to output a merged current (e.g., a sum current $I_j$, see FIG. 4E) as a function of both a first total current flow (e.g., a total current $I_{b1}$) in the first common second control line and a second total current flow (e.g., a total current $I_{b2}$) in the second common second control line.

According to various aspects, the analog to digital converter 550 of the multiply and accumulate circuit 500 may be coupled (e.g., electrically conductively connected) to the current merge circuit 570 and configured to convert the merged current into the digital output signal 550i, see, for example, FIG. 4E. A respective digital output value of the digital output signal 550i may represent a sum of results of respective multiplication operations of the first set of the plurality of operation cells 502 (e.g., of the plurality of multiply operation circuits) and/or a sum of results of respective multiplication operations of the second set of the plurality of operation cells 502 (e.g., of the plurality of multiply operation circuits).

It is noted that a current merge circuit may be not necessarily required. In some aspects, and an A-DC may be used for each second control line (BL) and a digital result of various second control line (BL) may be shifted and added together according to a specific control-line weight, which allows for omitting a current merge from various second control lines. However, a current merge may allow doing this in a single step in the analog domain.

According to various aspects, a multiply operation circuit or an operation cell of a multiply and accumulate circuit may include one or more switches and a field-effect transistor, according to various aspects. Aspects of configurations of an operation cell 502 or a multiply operation circuit 300 including only one switch 320, 502s are illustrated in FIGS. 3 to 5E and described above in detail. However, in a similar way, a plurality of switches 320, 502s may be coupled in parallel to one another and a shared FET 310, 502t may be coupled in series with the plurality of switches 320, 502s. MAC operations may be performed subsequently for the respective combinations of the shared FET 310, 502t with a respective switch of the plurality of switches 320, 502s. As an example, a first MAC operation may be performed for a first series connection including the shared FET 310, 502t and a first switch of the plurality of switches 320, 502s and a second MAC operation may be performed for a second series connection including the shared FET 310, 502t and a second switch of the plurality of switches 320, 502s. Illustratively, each switch of the plurality of switches provides in combination with the field-effect transistor, an operation cell to perform a MAC operation.

Figure 6A:
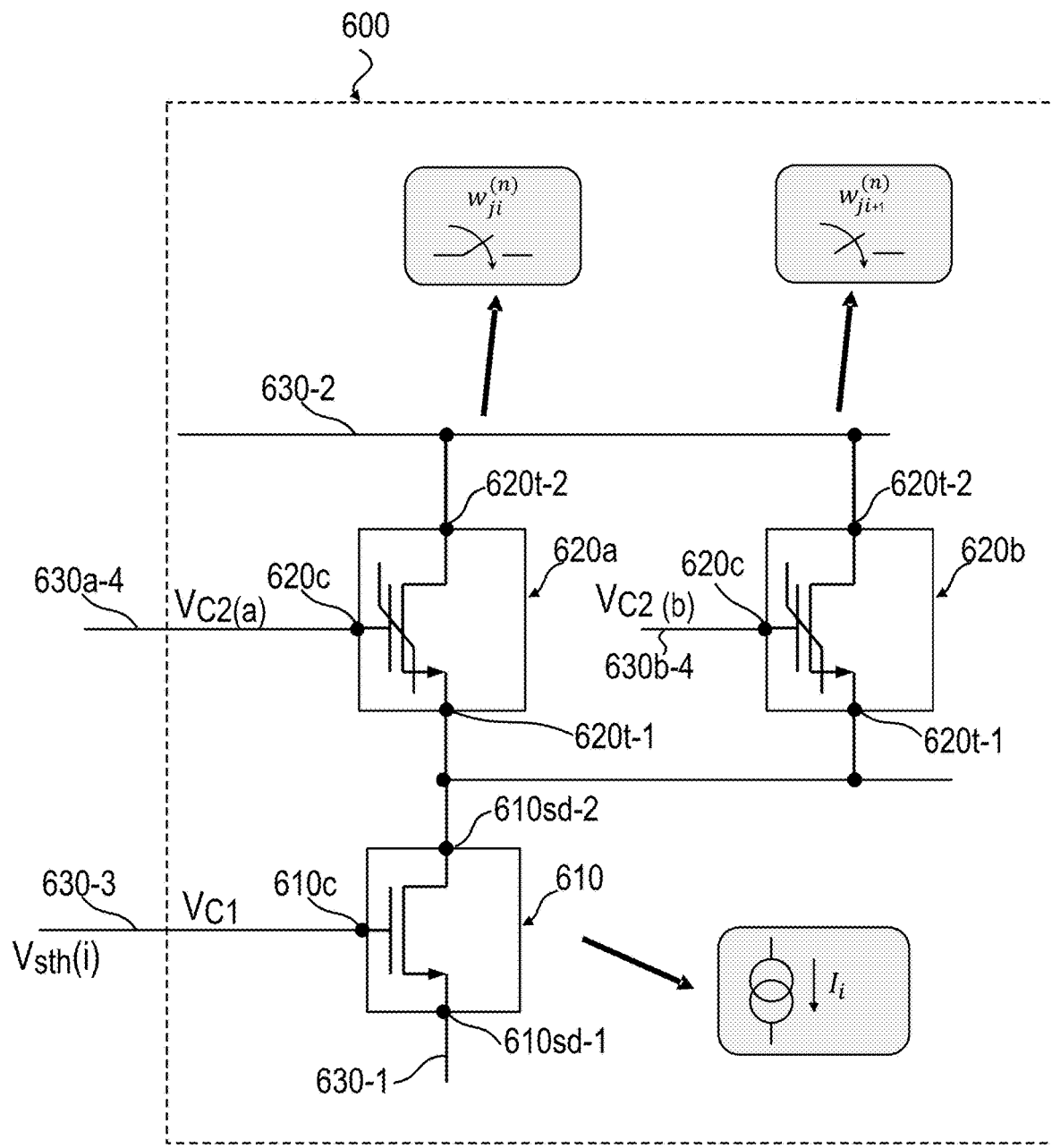
FIG. 6A shows schematically a multiply operation circuit, according to various aspects.

FIG. 6A shows a multiply operation circuit 600 in a schematic view, according to various aspects. The multiply operation circuit 600 may include a field-effect transistor 610 and a plurality of switches, e.g., a first switch 620a and a second switch 620b. According to various aspects, the multiply operation circuit 600 may be used to provide operation cells in a multiply and accumulate function (MAC) circuit or any other implementation of a multiply and accumulate function, similar, for example, with the implementations shown in FIGS. 4A to 4E, FIGS. 5A to 5E, and FIG. 6B.

According to various aspects, the field-effect transistor 610 may have a first source/drain terminal 610sd-1, a second source/drain terminal 610sd-2, and a control terminal 610c. The first source/drain terminal 610sd-1 of the field-effect transistor 610 may be coupled (e.g., electrically conductively connected) to a first control line 630-1. The first switch 620a and the second switch 620b may each have a first terminal 620t-1, a second terminal 620t-2, and a control terminal 620c to change a switch state of a respective switch 620a, 620b between at least two switch states associated with the respective switch 620a, 620b. The first terminal 620t-1 of the first switch 620a may be coupled (e.g., electrically conductively connected) to the second source/drain terminal 610sd-2 of the field-effect transistor 610. The first terminal 620t-1 of the second switch 620b may be coupled (e.g., electrically conductively connected) to the second source/drain terminal 610sd-2 of the field-effect transistor 610. The second terminal 620t-2 of the first switch 620a may be coupled (e.g., electrically conductively connected) to a second control line 630-2. The second terminal 620t-2 of the second switch 620b may be coupled (e.g., electrically conductively connected) to the second control line 630-2. Illustratively, the plurality of switches, e.g., the first switch 620a and the second switch 620b, may be coupled in parallel to one another between the second control line 630-2 and the second source/drain terminal 610sd-2 of the field-effect transistor 610. In some aspects, the plurality of switches may share a common field-effect transistor to realize the functions described above with reference to the field-effect transistor 310 and the switch 320 of the multiply operation circuit 300 (see, for example, FIG. 3 and FIG. 4A to FIG. 4E) and/or the functions described above with reference to the operation cell 502 (see, for example, FIG. 5A to FIG. 5E) in subsequent operations, wherein, in a first operation, the field-effect transistor 610 and the first switch 620a realize a multiply function and/or a MAC function and wherein, in a second operation, the field-effect transistor 610 and the second switch 620b realize a multiply function and/or a MAC function.

Furthermore, the control terminal 610c of the field-effect transistor 610 may be coupled (e.g., electrically conductively connected) to a third control line 630-3, the control terminal 620c of the first switch 620a may be coupled (e.g., electrically conductively connected) to a (e.g., first) fourth control line 630a-4 and the control terminal 620c of the second switch 620b may be coupled (e.g., electrically conductively connected) to another (e.g., a second) fourth control line 630b-4. According to various aspects, the first control line 630-1, the second control line 630-2, the third control line 630-3, and the respective one of the fourths control lines 630a-4, 630b-4 may be coupled (e.g., electrically conductively connected) to one or more input/output circuits to operate the multiply operation circuit 600.

According to various aspects, the field-effect transistor 610 and the first switch 620a may be configured to control a current flow ($I_i$) between the first control line 630-1 and the second control line 630-2 as a function of both a first control voltage ($V_{C1}$) provided at the control terminal 610c of the field-effect transistor 610 (e.g., provided via the third control line 630-3 to the field-effect transistor 610) and a (e.g., first) second control voltage ($V_{C2}(a)$) provided at the control terminal 620c of the first switch 620a (e.g., provided via the (first) fourth control line 630a-4 to the first switch 620) in combination with a switch state in which the first switch 620a is residing to realize a first multiplication operation ($I_i$ times $w_{ij}(n)$)). The first control voltage ($V_{C1}$ or $V_{sth}(i)$) may represent a first variable (e.g., a first factor) of the first multiplication operation. According to various aspects, a response of the first switch 620a upon the second control voltage ($V_{C2}$) may represent a second variable of the first multiplication operation. In some aspects, an actual switch state in which the first switch 620a may reside in may represent the second variable of the multiplication operation. In the case that a voltage controlled first switch 620a is used, as illustrated in FIG. 6A, the second control voltage ($V_{C2}(a)$) may be a select voltage and the first switch 620a may be, in response to the select voltage, in one of a plurality of switch states. The plurality of switch states of one or both of the switches 620a, 620b (or of all of the plurality of switches of the multiply operation circuit 600) may be influenced by a respective functional layer (e.g., a memory layer) included in the respective switch. As an examples, the respective switch 620a, 620b may be in a first switch state in the case that the select voltage is applied to the control terminal 620c of the respective switch 620a, 620b in the case that the corresponding functional layer is in a first state (e.g., a remanently polarizable layer may be in a first polarization state) and the respective switch 620a, 620b may be in a second switch state in the case that the select voltage is applied to the control terminal 620c of the respective switch 620a, 620b in the case that the corresponding functional layer is in a second state (e.g., a remanently polarizable layer may be in a second polarization state). Illustratively, the respective switch 620a, 620b may be a remanent (e.g., a remanently programmable) switch based on at least one memory layer included in the respective switch 620a, 620b. The respective switch 620a, 620b may be a FeFET that can be written into at least a first memory state and a second memory state, wherein the memory states defined the switch states of the respective switch 620a, 620b. According to various aspects, a switch state of the respective switch 620a, 620b may represent a respective second variable (e.g., a second factor) of the multiplication operation. The current flow ($I_i$) between the first control line 630-1 and the second control line 630-2 (i.e. between the first source/drain terminal 610sd-1 of the field-effect transistor 610 and the second terminal 620t-2 of the respective switch 620a, 620b) may represent a product (in other words a result of the multiplication operation) of the first variable and the respective second variable.

According to various aspects, FIG. 6A illustrates a multiply operation circuit 600 including two three terminal switches 620a, 620b, e.g., voltage controlled switches. However, in the case that the respective switch is not voltage controlled, the switch may include only two terminals, namely, the first terminal and the second terminal.

In the following, various details are described with reference to a multiply operation circuit 600 and a realization of various MAC functions. As illustrated in FIG. 6A, an electrical input current, $I_i$, (as a first variable of a multiply operation) may be associated with the current flow defined by the field-effect transistor 610 of each multiply operation circuit 600 and two weight factors, $w_{ji}$ and $w_{ji+1}$, (as second variables of respective multiply operations) may be associated with the switch states defined by the switches 620a, 620b of the multiply operation circuit 600.

Figure 6B:
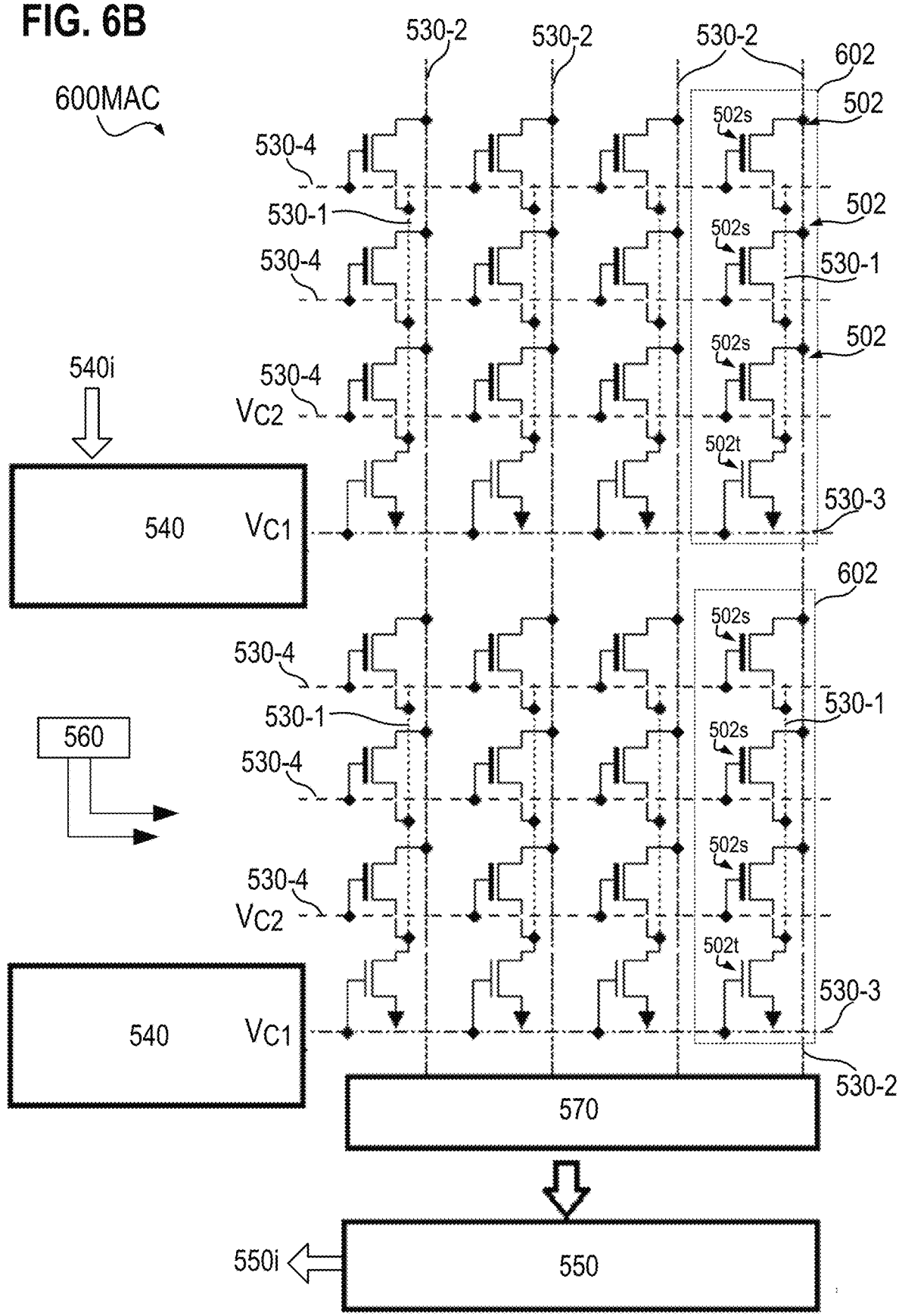
FIG. 6B shows schematically various aspects of a multiply and accumulate circuit.

FIG. 6B shows a multiply and accumulate circuit 600MAC in a schematic view, according to various aspects. The multiply and accumulate circuit 600MAC may include a plurality of multiply operation cells 502 configured in a matrix arrangement. Various sets 602 of multiply operation cells 502 may be configured as described herein with reference to the multiply operation circuit 600. FIG. 6B shows an exemplary configuration, wherein three FeFETs 502s (as the switch elements of the operation cells 502) share a common n-FET 502t (as the field-effect transistor element of the operation cells 502). However, other configurations (e.g., a flash memory cell as a switch element) may be used in a similar way. It is noted that the three FeFETs 502s are exemplarily to illustrate how a plurality of programmable switches can share a common field-effect transistor and provide the desired multiply operations in a series of distinct operations.

The multiply and accumulate circuit 600MAC may include control lines, digital to analog converters 540, an analog to digital converter 550, a current merge circuit 570, one or more control circuits 560 configured in a similar way as described with reference to the multiply and accumulate circuit 500, with the difference that three programmable switches 502s share a common field-effect transistor 502t; therefore, reference is made to the description provided above.

According to various aspects, as illustrated in FIG. 6B, the FETs 502t may be shared across three fourth control lines 530-4 (FeFetG) associated with the corresponding FeFETs 502s. These fourth control lines 530-4 may be selected one at a time, each time with an individual voltage applied to the common FETs 502t (from the corresponding D-AC 540). In this way, the die size impact caused by the FETs may be reduced; however, it may take more time to complete a multiply operation.

According to various aspects, only one of the FeFET gates of the FeFETs 502s may be active at a time per each set 602 of multiply operation cells.

According to various aspects, various sets 602 of multiply operation cells may share a common second control line 530-2. However, these various sets 602 that share a common second control line 530-2 may not share a common first control line 530-1. Furthermore, these various sets 602 that share a common second control line 530-2 may not share a common digital to analog converter 540. In other words, each set 602 of operation cells 502 that share a common second control line 530-2 may have a corresponding digital to analog converter 540 associated therewith.

Figure 7:
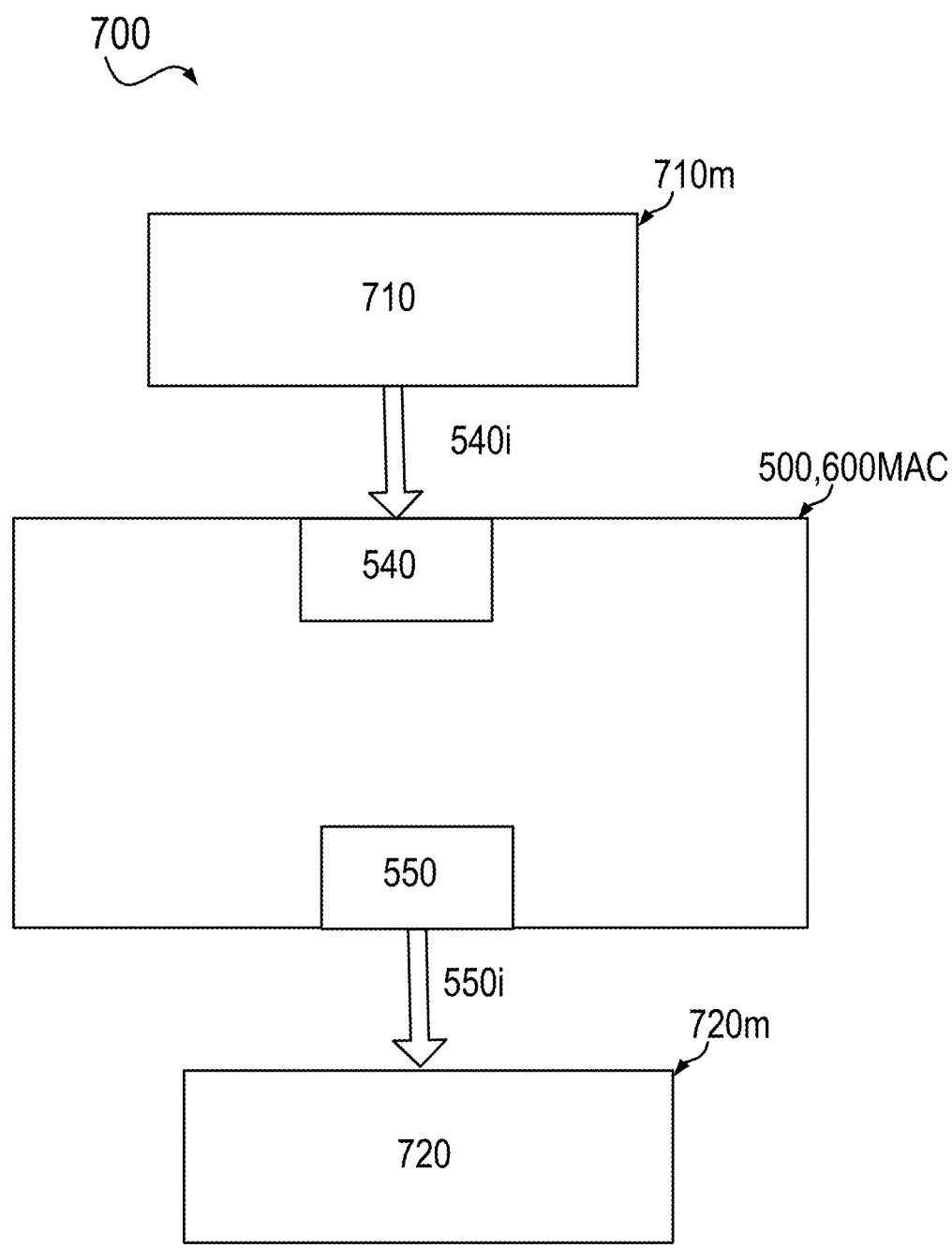
FIG. 7 shows schematically various aspects of an operation of a multiply and accumulate circuit in a neuronal network environment.

FIG. 7 shows an in-out flow diagram or a multiply and accumulate circuit in a neuronal network environment 700 (e.g., for the multiply and accumulate circuit 500 or the multiply and accumulate circuit 600MAC), according to various aspects. According to various aspects, the neuronal network environment 700 may include a first neuronal network layer 710 and a subsequent (e.g., second) neuronal network layer 720. The voltages generated by the one or more digital to analog converters 540 of the multiply and accumulate circuit 500, 600MAC may be derived from a first memory (e.g., from a static random-access memory) array 710m holding the neuron states of the first layer 710. A digital input signal 540i is provided to the one or more digital to analog converters 540 of the multiply and accumulate circuit 500, 600MAC and the input voltages are provided accordingly to the respective field-effect transistors of the operation cells of the multiply and accumulate circuit 500, 600MAC. The MAC operation result may be stored in a second memory (e.g., in a static random-access memory) array 720m representing the second neuronal network layer 720. The currents that result from MAC operations may be converted into a digital output signal 550i by the analog to digital converter 550 of the multiply and accumulate circuit 500, 600MAC. The digital output signal 550i may be provided to store the results in the second memory array 720m.

Figure 8:
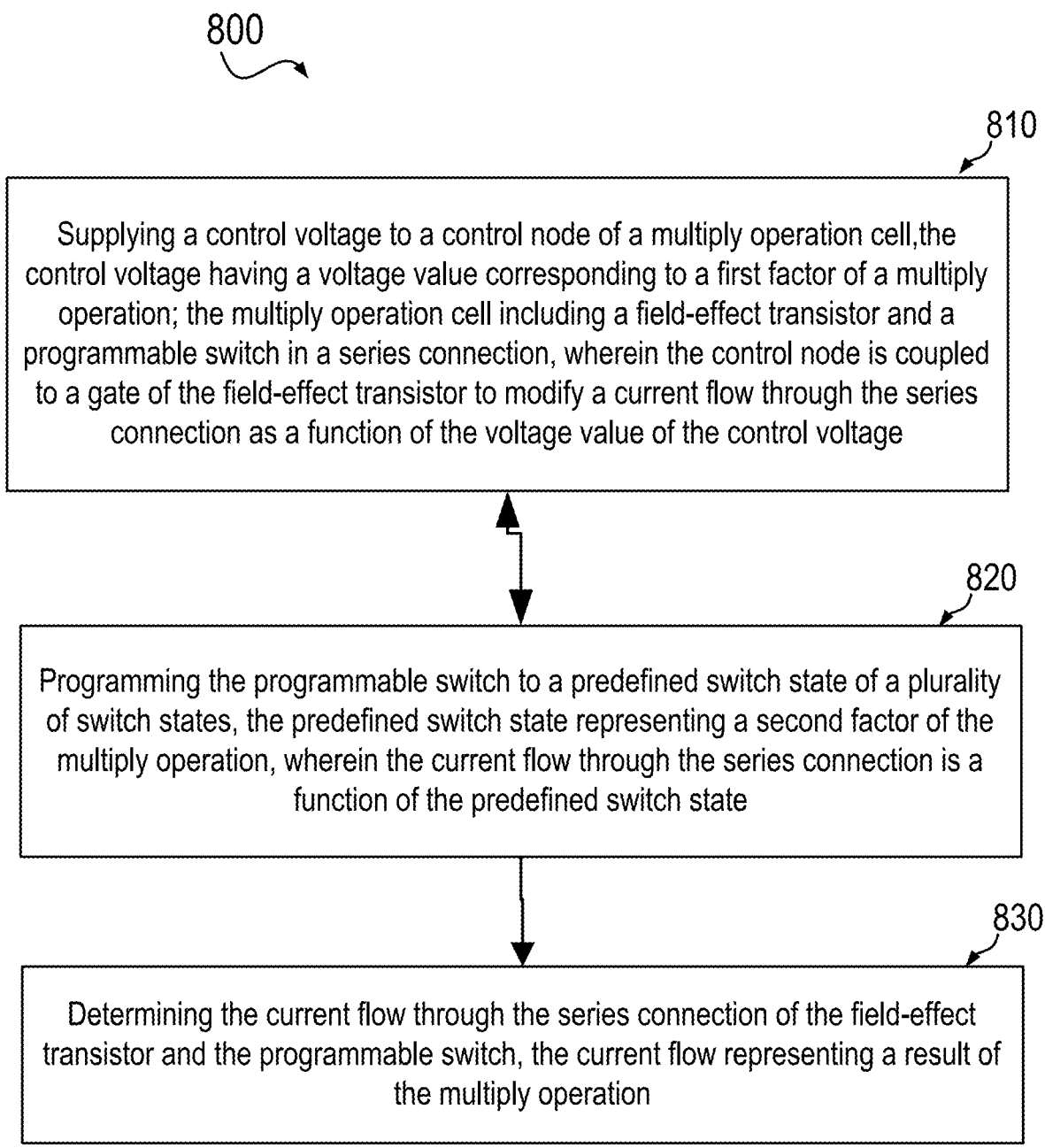
FIG. 8 shows a schematic flow diagram of a method for operating a multiply operation cell, according to various aspects.

FIG. 8 shows a schematic flow diagram of a method 800 for operating a multiply operation cell, e.g., an operation cell 502 of the multiply and accumulate circuit 500 or of the multiply and accumulate circuit 600MAC, according to various aspects. The method 800 may include: e.g., in 810, supplying a control voltage to a control node of a multiply operation cell (e.g., to a control terminal of a field-effect transistor of the multiply operation cell, e.g., to a third control line 530-3 of a multiply and accumulate circuit 500, 600MAC corresponding to the multiply operation cell), the control voltage having a voltage value corresponding to a first factor of a multiply operation; the multiply operation cell including a field-effect transistor and a programmable switch in a series connection, wherein the control node is coupled to a gate of the field-effect transistor to modify a current flow through the series connection as a function of the voltage value of the control voltage. The method 800 may further include: e.g., in 820, programming the programmable switch to a predefined switch state of a plurality of switch states, the predefined switch state representing a second factor of the multiply operation, wherein the current flow through the series connection is a function of the predefined switch state. The method 800 may further include: e.g., in 830, determining the current flow through the series connection of the field-effect transistor and the programmable switch, the current flow representing a result of the multiply operation.

FIG. 9 shows a schematic flow diagram of a method 900 for operating a set of multiply operation cells, e.g., a set of multiply operation cells 502 of the multiply and accumulate circuit 500 or of the multiply and accumulate circuit 600MAC, according to various aspects. The method 900 may include: e.g., in 910, supplying a first control voltage to a control node of a first multiply operation cell (e.g., to a control terminal of a field-effect transistor of the first multiply operation cell, e.g., to a third control line 530-3 of a multiply and accumulate circuit 500, 600MAC corresponding to the first multiply operation cell), the first control voltage having a voltage value corresponding to a first factor of a first multiply operation; the first multiply operation cell including a first field-effect transistor and a first programmable switch in a first series connection, wherein the control node of the first multiply operation cell is coupled to a gate of the first field-effect transistor to modify a first current flow through the first series connection as a function of the voltage value of the first control voltage. The method 900 may further include: e.g., in 920, programming the first programmable switch of the first multiply operation cell to a first predefined switch state of a plurality of switch states, the first predefined switch state representing a second factor of the first multiply operation, wherein the first current flow through the first series connection is a function of the first predefined switch state. The method 900 may further include: e.g., in 930, supplying a second control voltage to a control node of a second multiply operation cell (e.g., to a control terminal of a field-effect transistor of the second multiply operation cell, e.g., to a third control line 530-3 of a multiply and accumulate circuit 500, 600MAC corresponding to the second multiply operation cell), the second control voltage having a voltage value corresponding to a first factor of a second multiply operation; the second multiply operation cell including a second field-effect transistor and a second programmable switch in a second series connection, wherein the control node of the second multiply operation cell is coupled to a gate of the second field-effect transistor to modify a second current flow through the second series connection as a function of the voltage value of the second control voltage. The method 900 may further include: e.g., in 940, programming the second programmable switch of the second multiply operation cell to a second predefined switch state of a plurality of switch states, the second predefined switch state representing a second factor of the second multiply operation, wherein the second current flow through the second series connection is a function of the second predefined switch state. The method 900 may further include: e.g., in 950, determining an accumulation of the first current flow through the first series connection and the second current flow through the second series connection, the accumulation representing a result of a sum of the first multiply operation and the second multiply operation.

In the following, various examples are provided that may refer to one or more aspects described above and/or illustrated in the figures.

Example 1 is a multiply operation circuit including: a field-effect transistor having a first source/drain terminal, a second source/drain terminal, and a control terminal, wherein the first source/drain terminal is coupled to a first control line; a switch having at least a first terminal and a second terminal, wherein the first terminal of the switch is coupled to the second source/drain terminal of the field-effect transistor, and wherein the second terminal of the switch is coupled to a second control line, wherein the field-effect transistor and the switch are configured to control a current flow between the first control line and the second control line as a function of both a first control voltage provided at the control terminal of the field-effect transistor and a switch state in which the switch is residing in to realize a multiplication operation, wherein the first control voltage represents a first variable of the multiplication operation and wherein the switch state represents a second variable of the multiplication operation and wherein the current flow between the first control line and the second control line represents a product of the first variable and the second variable.

In Example 2, the multiply operation circuit of Example 1 may optionally further include that the switch is a voltage controlled switch and includes a control terminal to change the switch state in which the switch is residing in between at least two switch states associated with the voltage controlled switch.

In Example 3, the multiply operation circuit of Example 1 or 2 may optionally further include that the control of the current flow between the first control line and the second control line is a function of both the first control voltage provided at the control terminal of the field-effect transistor and a response of the switch upon an application of a control voltage provided at the control terminal of the switch. According to various aspects, the response of the switch upon the application of the control voltage provided at the control terminal of the switch is a function of the switch state in which the switch is residing in.

In Example 4, the multiply operation circuit of any one of Examples 1 to 3 may optionally further include: a digital to analog converter coupled to the control terminal of the field-effect transistor and configured to convert a digital input signal into an analog voltage signal to provide the first control voltage to the control terminal of the field-effect transistor, wherein a respective voltage value of the analog voltage signal represents a corresponding digital input value represented by the digital input signal.

In Example 5, the multiply operation circuit of any one of Examples 1 to 4 may optionally further include: an analog to digital converter coupled to the second control line and configured to convert a current flow through the second control line into a digital output signal, wherein a respective digital output value of the digital output signal represents at least a result of the multiplication operation.

In Example 6, the multiply operation circuit of any one of Examples 1 to 5 may optionally further include that the switch is a programmable switch, e.g., a non-volatile switch.

In Example 7, the multiply operation circuit of any one of Examples 1 to 6 may optionally further include that the switch (is, for example, a non-volatile switch) includes a remanent-polarizable layer. According to various aspects, the switch state of the switch may correspond to a polarization state of the remanent-polarizable layer of at least two polarization states of the remanent-polarizable layer. In other aspects, the switch (e.g., a non-volatile or volatile switch) may include a spontaneously-polarizable layer, e.g., a spontaneously and remanently polarizable layer (e.g., a ferroelectric layer) and/or a spontaneously and non-remanently polarizable layer (e.g., an anti-ferroelectric layer). According to various aspects, the switch state of the switch may correspond to a polarization state of the spontaneously-polarizable layer of at least two polarization states of the spontaneously-polarizable layer.

In Example 8, the multiply operation circuit of any one of Examples 1 to 7 may optionally further include: one or more control circuits coupled to the field-effect transistor and the switch and configured to provide a set of operation voltages to the field-effect transistor and to the switch to selectively bring the switch into a predefined switch state of at least two switch states.

In Example 9, the multiply operation circuit of Example 8 may optionally further include that the one or more control circuits are further configured to provide the set of operation voltages (e.g., programming voltages and/or erase voltages) such that a predefined voltage is applied at the second source/drain terminal of the field-effect transistor and at the first terminal of the switch by dynamically controlling an operation voltage applied at the control terminal of the field-effect transistor and by dynamically controlling an operation voltage applied at the first source/drain terminal of the field-effect transistor.

In Example 10, the multiply operation circuit of any one of Examples 1 to 9 may optionally further include: an additional switch. The multiply operation circuit may include this a plurality of switches. The switches of the multiply operation circuit may be of the same type and/or configuration. The additional switch may include a first terminal, a second terminal, and a control terminal to change a switch state of the additional switch between at least two switch states associated with the additional switch. The first terminal of the additional switch may be coupled to the second source/drain terminal of the field-effect transistor, and wherein the second terminal of the additional switch is coupled to the second control line.

In Example 11, the multiply operation circuit of Example 10 may optionally further include that the field-effect transistor and the additional switch are configured to control an additional current flow between the first control line and the second control line as a function of both the first control voltage provided at the control terminal of the field-effect transistor and a response of the additional switch upon an application of an additional second control voltage provided at the control terminal of the additional switch to realize an additional multiplication operation.

In Example 12, the multiply operation circuit of Example 11 may optionally further include that the response of the additional switch upon the application of the additional second control voltage represents an additional second variable of the additional multiplication operation and that the additional current flow between the first control line and the second control line represents an additional product of the first variable and the additional second variable, or the multiply operation circuit of Example 11 may optionally further include that the response of the additional switch upon the application of the additional second control voltage represents an additional second variable of the additional multiplication operation and that the additional current flow between the first control line and the second control line represents an additional product of an additional first variable and the additional second variable.

Example 13 is a multiply and accumulate circuit including: a plurality of multiply operation circuits, each multiply operation circuit of the plurality of multiply operation circuits configured in accordance with the multiply operation circuit of any one of Examples 1 to 12. According to various aspects, a set of multiply operation circuits of the plurality of multiply operation circuits may share the respective second control line as a common second control line such that current flows of the plurality of multiply operation circuits accumulate to a total current flow on the common second control line.

In Example 14, the multiply and accumulate circuit of Example 13 may optionally further include: an analog to digital converter coupled to the common second control line and configured to convert the total current flow through the common second control line into a digital output signal, wherein a respective digital output value of the digital output signal represents a sum of results of respective multiplication operations of the plurality of multiply operation circuits.

Example 15 is a multiply and accumulate circuit including: a plurality of multiply operation circuits, each multiply operation circuit of the plurality of multiply operation circuits configured in accordance with to the multiply operation circuit of any one of Examples 1 to 12. According to various aspects, all multiply operation circuits of a first set of the plurality of multiply operation circuits may share the second control line as a first common second control line such that current flows of the first set of the plurality of multiply operation circuits accumulate to a first total current flow on the first common second control line, and all multiply operation circuits of a second set of the plurality of multiply operation circuits may share the second control line as a second common second control line such that current flows of the second set of the plurality of multiply operation circuits accumulate to a second total current flow on the second common second control line.

In Example 16, the multiply and accumulate circuit of Example 15 may optionally further include: a current merge circuit coupled to the first common second control line and second common second control line and configured to output a merged current as a function of both the first total current flow and the second total current flow.

In Example 17, the multiply and accumulate circuit of Example 16 may optionally further include: an analog to digital converter coupled to the current merge circuit and configured to convert the merged current into a digital output signal, wherein a respective digital output value of the digital output signal represents a sum of results of respective multiplication operations of the first set of the plurality of multiply operation circuits and/or a sum of results of respective multiplication operations of the second set of the plurality of multiply operation circuits.

Example 18 is a multiply and accumulate circuit including: a plurality of multiply operation cells configured in a matrix arrangement; wherein each multiply operation cell of the plurality of multiply operation cells includes: a field-effect transistor and a programmable switch in a series connection between a first control line node and a second control line node, wherein the field-effect transistor is configured to be controlled by a third control line node coupled to a gate of the field-effect transistor and wherein the switch is configured to be controlled by a fourth control line node coupled to the programmable switch, wherein the field-effect transistor and the programmable switch are configured to control a current flow between the first control line node and the second control line node as a function of both a first control voltage provided at the third control line node and a second control voltage provided at the fourth control line node to realize a multiplication operation, wherein the first control voltage represents a first variable of the multiplication operation and wherein a response of the programmable switch to the second control voltage represents a second variable of the multiplication operation and wherein the current flow between the first control line node and the second control line node represents a product of the first variable and the second variable; wherein a respective multiply operation cell of the plurality of multiply operation cells is configured to be individually operable by a first control line of a set of first control lines coupled to the first control line node of the respective multiply operation cell, a second control line of a set of second control lines coupled to the second control line node of the respective multiply operation cell, a third control line of a set of third control lines coupled to the third control line node of the respective multiply operation cell, and a fourth control line of a set of fourth control lines coupled to the fourth control line node of the respective multiply operation cell; and wherein the plurality of multiply operation cells includes various sets of multiply operation cells that share the respective second control line as a common second control line, and wherein the plurality of multiply operation cells includes various other sets of multiply operation cells that share both the respective third control line as a common third control line and the respective fourth control line as a common fourth control line.

In Example 19, the multiply and accumulate circuit of Example 18 may optionally further include: a digital to analog converter coupled to the set of third control lines and configured to convert a digital input into an analog voltage input defining the first control voltage of the respective multiply operation cell, wherein a voltage value of the first control voltage represents a digital input value represented by the digital input.

In Example 20, the multiply and accumulate circuit of Example 18 or 19 may optionally further include: a current merge circuit coupled to the set of second control lines and configured to output a merged current as a function of a total current flow in each second control line of the set of second control lines.

In Example 21, the multiply and accumulate circuit of Example 20 may optionally further include: an analog to digital converter coupled to the current merge circuit and configured to convert the merged current into a digital output signal, wherein a respective digital output value of the digital output signal represents a set of results of respective multiplication and accumulation operations of the plurality of multiply operation cells.

In Example 22, the multiply and accumulate circuit of Example 20 may optionally further include: a set of analog to digital converters coupled to the set of second control lines and configured to output a set of digital output signals, wherein a respective digital output value of each of the set of digital output signals represents a result of respective multiplication and accumulation operations of multiply operation cells that share a corresponding second control line of the set of second control lines.

Example 23 is a method for operating a multiply operation cell, the method including: supplying a control voltage to a control node of a multiply operation cell, the control voltage having a voltage value corresponding to a first factor of a multiply operation; the multiply operation cell including a field-effect transistor and a programmable switch in a series connection, wherein the control node is coupled to a gate of the field-effect transistor to modify a current flow through the series connection as a function of the voltage value of the control voltage; programming the programmable switch to a predefined switch state of a plurality of switch states, the predefined switch state representing a second factor of the multiply operation, wherein the current flow through the series connection is a function of the predefined switch state; and determining the current flow through the series connection of the field-effect transistor and the programmable switch, the current flow representing a result of the multiply operation.

Example 24 is a method for operating a set of multiply operation cells, the method including: supplying a first control voltage to a control node of a first multiply operation cell, the first control voltage having a voltage value corresponding to a first factor of a first multiply operation; the first multiply operation cell including a first field-effect transistor and a first programmable switch in a first series connection, wherein the control node of the first multiply operation cell is coupled to a gate of the first field-effect transistor to modify a first current flow through the first series connection as a function of the voltage value of the first control voltage; programming the first programmable switch of the first multiply operation cell to a first predefined switch state of a plurality of switch states, the first predefined switch state representing a second factor of the first multiply operation, wherein the first current flow through the first series connection is a function of the first predefined switch state; supplying a second control voltage to a control node of a second multiply operation cell, the second control voltage having a voltage value corresponding to a first factor of a second multiply operation; the second multiply operation cell including a second field-effect transistor and a second programmable switch in a second series connection, wherein the control node of the second multiply operation cell is coupled to a gate of the second field-effect transistor to modify a second current flow through the second series connection as a function of the voltage value of the second control voltage; programming the second programmable switch of the second multiply operation cell to a second predefined switch state of a plurality of switch states, the second predefined switch state representing a second factor of the second multiply operation, wherein the second current flow through the second series connection is a function of the second predefined switch state; and determining an accumulation of the first current flow through the first series connection and the second current flow through the second series connection, the accumulation representing a result of a sum of the first multiply operation and the second multiply operation.

Example 25 is a multiply and accumulate circuit including: a plurality of multiply operation cells (see index i ranging from 1 to N and index j ranging from 1 to M) configured in a matrix arrangement (e.g., an N×M matrix arrangement), each respective multiply operation cell of the multiply operation cells including: a field-effect transistor and a programmable switch in a series connection, wherein the field-effect transistor and the programmable switch are configured to control a current flow through the respective multiply operation cell to realize a multiplication operation, wherein all multiply operation cells of a first set of the plurality of multiply operation cells (e.g., the set may be defined by all multiply operation cell having the same value for j) share a corresponding control line to realize an accumulation operation.

According to various aspects, the switch of any one of Examples 1 to 25 (e.g., the programmable switch) may include a field-effect transistor structure and a spontaneous-polarizable layer comprised in or coupled to a gate of the field-effect transistor structure.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "coupled" may be used herein with respect to nodes, terminals, integrated circuit elements, and the like, to mean electrically connected, e.g., electrically conductively connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A multiply operation circuit comprising:
a field-effect transistor having a first source/drain terminal, a second source/drain terminal, and a control terminal, wherein the first source/drain terminal is coupled to a first control line; and
a switch having at least a first terminal and a second terminal, wherein the first terminal of the switch is coupled to the second source/drain terminal of the field-effect transistor, and wherein the second terminal of the switch is coupled to a second control line, wherein the switch comprises a spontaneous-polarizable layer, wherein a switch state of the switch corresponds to a polarization state of the spontaneous-polarizable layer of at least two polarization states of the spontaneous-polarizable layer,
wherein the field-effect transistor and the switch are configured to control a current flow between the first control line and the second control line as a function of both a first control voltage provided at the control terminal of the field-effect transistor and the switch state in which the switch is residing in to realize a multiplication operation, wherein the first control voltage represents a first variable of the multiplication operation and wherein the switch state represents a second variable of the multiplication operation and wherein the current flow between the first control line and the second control line represents a product of the first variable and the second variable.

2. The multiply operation circuit of claim 1, wherein the switch is a voltage controlled switch and comprises a control terminal to change the switch state in which the switch is residing in between at least two switch states associated with the voltage controlled switch.

3. The multiply operation circuit of claim 2, wherein the control of the current flow between the first control line and the second control line is a function of both the first control voltage provided at the control terminal of the field-effect transistor and a response of the switch upon an application of a control voltage provided at the control terminal of the switch.

4. The multiply operation circuit of claim 1, further comprising:
a digital to analog converter coupled to the control terminal of the field-effect transistor and configured to convert a digital input signal into an analog voltage signal to provide the first control voltage to the control terminal of the field-effect transistor, wherein a respective voltage value of the analog voltage signal represents a corresponding digital input value represented by the digital input signal.

5. The multiply operation circuit of claim 1, further comprising:
an analog to digital converter coupled to the second control line and configured to convert a current flow through the second control line into a digital output signal, wherein a respective digital output value of the digital output signal represents at least a result of the multiplication operation.

6. The multiply operation circuit of claim 1, wherein the switch is a programmable switch.

7. The multiply operation circuit of claim 1, further comprising:
one or more control circuits coupled to the field-effect transistor and the switch and configured to provide a set of operation voltages to the field-effect transistor and to the switch to selectively bring the switch into a predefined switch state of at least two switch states.

8. The multiply operation circuit of claim 7, wherein the one or more control circuits are further configured to provide the set of operation voltages such that a predefined voltage is applied at the second source/drain terminal of the field-effect transistor and at the first terminal of the switch by dynamically controlling an operation voltage applied at the control terminal of the field-effect transistor and by dynamically controlling an operation voltage applied at the first source/drain terminal of the field-effect transistor.

9. The multiply operation circuit of claim 1, further comprising:
an additional switch having a first terminal, a second terminal, and a control terminal to change a switch state of the additional switch between at least two switch states associated with the additional switch, wherein the first terminal of the additional switch is coupled to the second source/drain terminal of the field-effect transistor, and wherein the second terminal of the additional switch is coupled to the second control line.

10. The multiply operation circuit of claim 9, wherein the field-effect transistor and the additional switch are configured to control an additional current flow between the first control line and the second control line as a function of both the first control voltage provided at the control terminal of the field-effect transistor and a response of the additional switch upon an application of an additional second control voltage provided at the control terminal of the additional switch to realize an additional multiplication operation.

11. The multiply operation circuit of claim 10, wherein the response of the additional switch upon the application of the additional second control voltage represents an additional second variable of the additional multiplication operation and wherein the additional current flow between the first control line and the second control line represents an additional product of the first variable and the additional second variable, or wherein the response of the additional switch upon the application of the additional second control voltage represents an additional second variable of the additional multiplication operation and wherein the additional current flow between the first control line and the second control line represents an additional product of an additional first variable and the additional second variable.

12. A multiply and accumulate circuit comprising:
a plurality of multiply operation circuits according to claim 1,
wherein a set of multiply operation circuits of the plurality of multiply operation circuits share the respective second control line as a common second control line such that current flows of the plurality of multiply operation circuits accumulate to a total current flow on the common second control line.

13. The multiply and accumulate circuit of claim 12, further comprising:
an analog to digital converter coupled to the common second control line and configured to convert the total current flow through the common second control line into a digital output signal, wherein a respective digital output value of the digital output signal represents a sum of results of respective multiplication operations of the plurality of multiply operation circuits.

14. A multiply and accumulate circuit comprising:
a plurality of multiply operation circuits according to claim 1,
wherein all multiply operation circuits of a first set of the plurality of multiply operation circuits share the second control line as a first common second control line such that current flows of the first set of the plurality of multiply operation circuits accumulate to a first total current flow on the first common second control line, and
wherein all multiply operation circuits of a second set of the plurality of multiply operation circuits share the second control line as a second common second control line such that current flows of the second set of the plurality of multiply operation circuits accumulate to a second total current flow on the second common second control line.

15. The multiply and accumulate circuit of claim 14, further comprising:

a current merge circuit coupled to the first common second control line and second common second control line and configured to output a merged current as a function of both the first total current flow and the second total current flow.

16. The multiply and accumulate circuit of claim 15, further comprising:
an analog to digital converter coupled to the current merge circuit and configured to convert the merged current into a digital output signal, wherein a respective digital output value of the digital output signal represents a sum of results of respective multiplication operations of the first set of the plurality of multiply operation circuits and/or a sum of results of respective multiplication operations of the second set of the plurality of multiply operation circuits.

17. A multiply and accumulate circuit comprising:
a plurality of multiply operation cells configured in a matrix arrangement, each respective multiply operation cell of the multiply operation cells comprising:
a field-effect transistor and a programmable switch in a series connection, wherein the field-effect transistor and the programmable switch are configured to control a current flow through the respective multiply operation cell to realize a multiplication operation,
wherein the programmable switch comprises a field-effect transistor structure and a spontaneous-polarizable layer comprised in or coupled to a gate of the field-effect transistor structure, wherein a switch state of the programmable switch corresponds to a polarization state of the spontaneous-polarizable layer of at least two polarization states of the spontaneous-polarizable layer, and
wherein all multiply operation cells of a first set of the plurality of multiply operation cells share a corresponding control line to realize an accumulation operation.

18. A multiply operation circuit comprising:
a field-effect transistor having a first source/drain terminal, a second source/drain terminal, and a control terminal, wherein the first source/drain terminal is coupled to a first control line; and
a switch having at least a first terminal and a second terminal, wherein the first terminal of the switch is coupled to the second source/drain terminal of the field-effect transistor, and wherein the second terminal of the switch is coupled to a second control line, wherein the switch is a voltage controlled switch and comprises a control terminal to change a switch state in which the switch is residing in between at least two switch states associated with the voltage controlled switch,
wherein the field-effect transistor and the switch are configured to control a current flow between the first control line and the second control line as a function of both a first control voltage provided at the control terminal of the field-effect transistor and the switch state in which the switch is residing in to realize a multiplication operation, wherein the control of the current flow between the first control line and the second control line is a function of both the first control voltage provided at the control terminal of the field-effect transistor and a response of the switch upon an application of a control voltage provided at the control terminal of the switch, wherein the first control voltage represents a first variable of the multiplication operation and wherein the switch state represents a second variable of the multiplication operation and wherein the current flow between the first control line and the second control line represents a product of the first variable and the second variable.

19. The multiply operation circuit of claim 18, wherein the switch comprises a spontaneous-polarizable layer, wherein a switch state of the switch corresponds to a polarization state of the spontaneous-polarizable layer of at least two polarization states of the spontaneous-polarizable layer.

20. The multiply operation circuit of claim 18, further comprising one or more control circuits coupled to the field-effect transistor and the switch and configured to provide a set of operation voltages to the field-effect transistor and to the switch to selectively bring the switch into a predefined switch state of at least two switch states.

* * * * *